United States Patent [19]
Maeno et al.

[11] Patent Number: 5,978,301
[45] Date of Patent: Nov. 2, 1999

[54] GATE ARRAY LSI

[75] Inventors: Muneaki Maeno; Yukinori Uchino; Yutaka Tanaka, all of Tokyo, Japan

[73] Assignee: Kabushiki Kaisha Toshiba, Kawasaki, Japan

[21] Appl. No.: 08/922,024

[22] Filed: Sep. 2, 1997

[30] Foreign Application Priority Data

Sep. 9, 1996 [JP] Japan .................................. 8-237885

[51] Int. Cl.$^6$ ................................................ H01L 27/10
[52] U.S. Cl. ........................................ 365/230.03; 326/41
[58] Field of Search ........................ 365/230.01, 230.03; 326/41

[56] References Cited

U.S. PATENT DOCUMENTS

| | | | |
|---|---|---|---|
| 5,500,609 | 3/1996 | Kean | 326/41 |
| 5,610,533 | 3/1997 | Arimoto et al. | 326/33 |
| 5,654,931 | 8/1997 | Tamba et al. | 365/230.03 |
| 5,787,033 | 7/1998 | Maeno | 365/182 |

*Primary Examiner*—Viet Q. Nguyen
*Attorney, Agent, or Firm*—Foley & Lardner

[57] ABSTRACT

The present invention relates to the improvement in the degree of on-chip integration of memory cells utilizing a gate array layout. A plurality of three-transistor DRAM cells are disposed on a semiconductor chip implementing a regular cross-point array, each DRAM cell is made up of two nMOS transistors and one pMOS transistor formed in one basic cell. The semiconductor chip disposes therein nMOS memory-cell blocks and pMOS memory-cell blocks alternately, effectively utilizing the gate array layout.

23 Claims, 30 Drawing Sheets

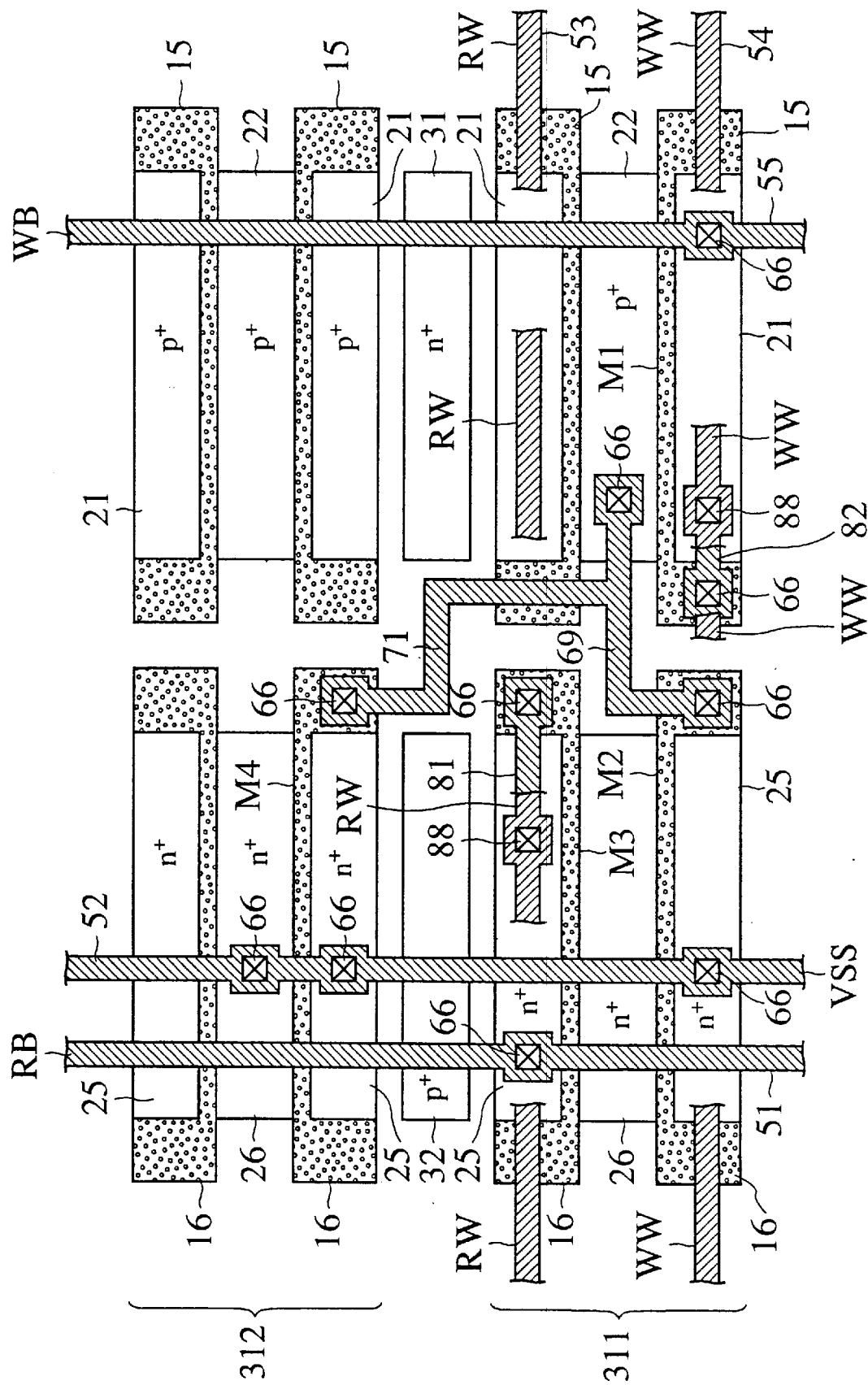

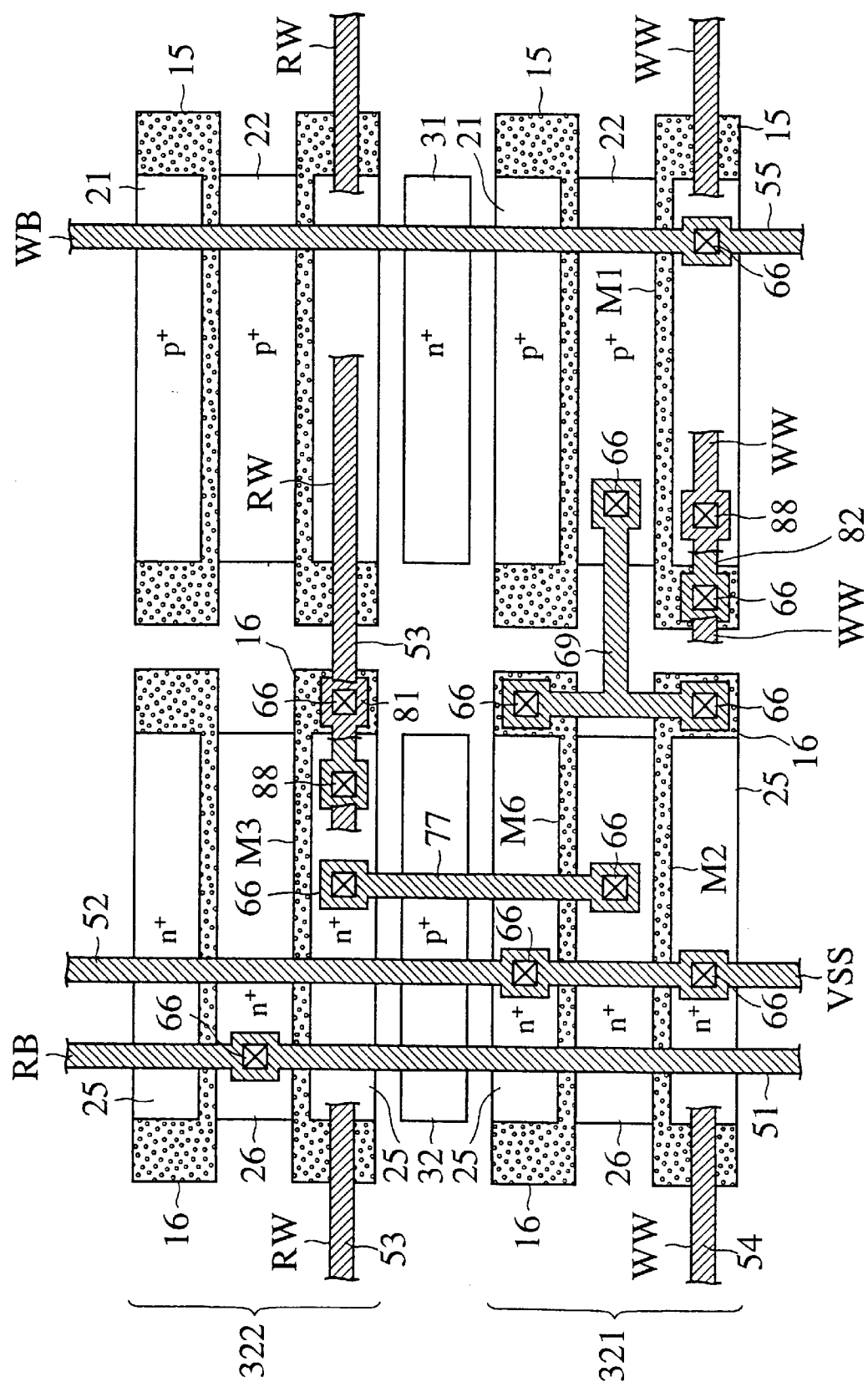

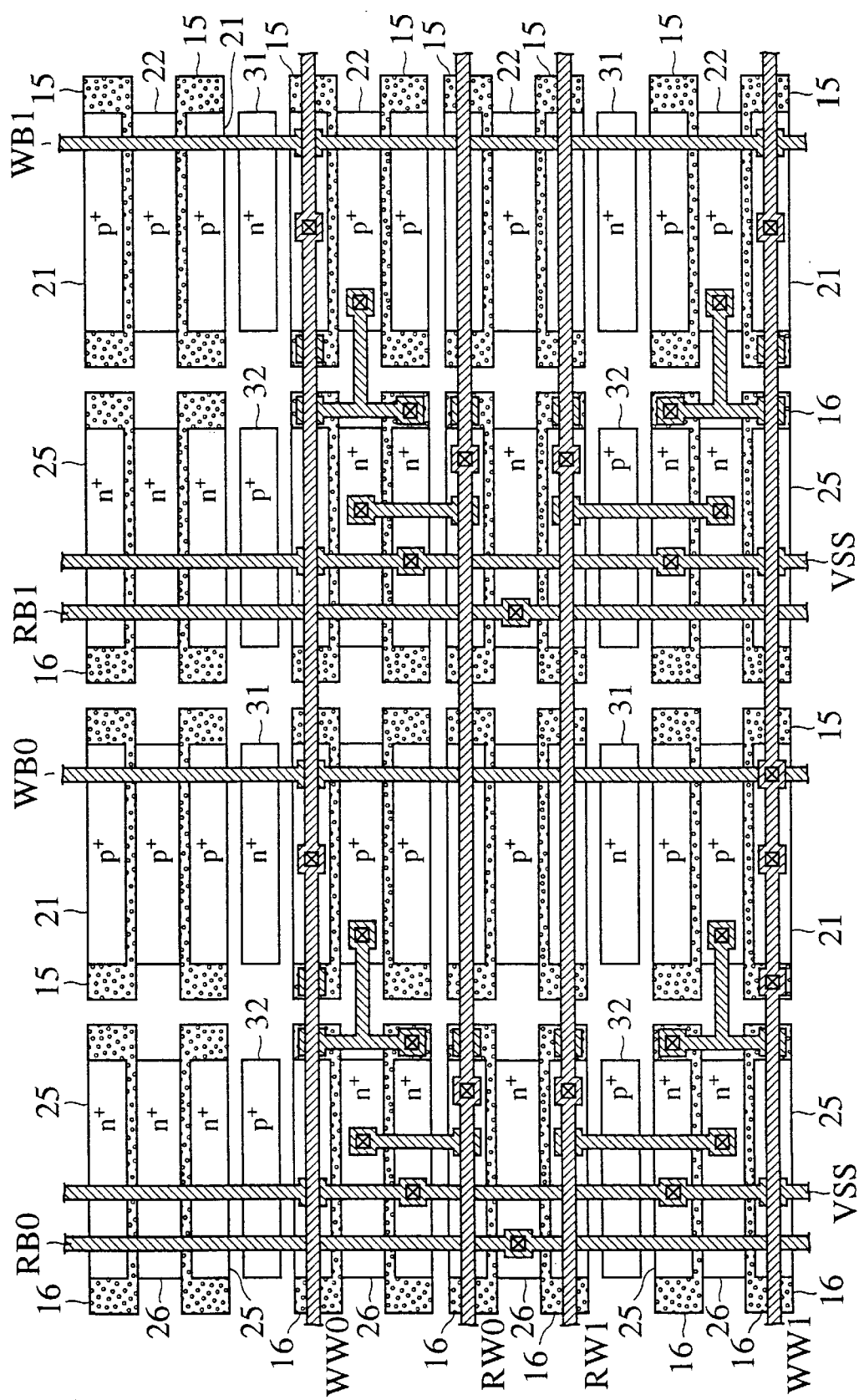

GATE ARRAY LSI

BACKGROUND OF THE INVENTION

1. Field of the Invention

The present invention relates in general to a gate array, LSI and more specifically to a semiconductor memory capable of non-destructive read-out operation, employing the geometrical configuration of the gate array LSI.

2. Description of the Prior Art

Various layout designs for a semiconductor integrated circuit may be prepared according to a scale of the integrated circuit and design approach. A fully-custom IC in which all layers are designed and manufactured for exclusive use is suited for the case where a large number of high performance ICs are to be manufactured. In contrast, a semicustom IC such as the gate array LSI or the Application-Specific Integrated Circuits (ASICs) in which layers located below a wiring layer level are manufactured in advance and then only wiring layers are designed and manufactured is suited for the case where specific-application ICs are to be manufactured in a short term. In addition, the semicustom IC has such an advantage that design cost and production cost can be reduced. However, as a semiconductor memory employing the geometrical configuration of the gate array LSI, only an SRAM (Static Random Access Memory) in which each cell being constructed of six transistors is known until now. This is because such six-transistor SRAMs can be made of only CMOS transistors arranged in the gate array configuration, having an excellent stability of the circuit.

With reference to FIGS. 1, 2A, and 2B, the following will describe a circuit construction of the six-transistor SRAMs based on the conventional gate array configuration. FIG. 1 shows a pattern of the basic cell which basically makes up each memory cell in a gate array. This basic cell comprises an nMOS region 11 and a pMOS region 13. In the nMOS region 11, two gate electrodes 16 are disposed in parallel. On the upper and the lower sides of a pair of these gate electrodes 16, an n$^+$ diffused region 25 is formed respectively, while between these two electrodes 16, a common n$^+$ diffused region 26 is formed, thus constructing two nMOS transistors. The n$^+$ diffused region 25 and n$^+$ diffused region 26 may be called an n$^+$ source region and n$^+$ drain region 26, respectively, in a case. In another case, these regions 25, 26 may be called as an n+ drain region 25 and n$^+$ source region 26, respectively, depending on a circuit configuration employed. Similarly, in the pMOS region 13, two gate electrodes 15 are disposed in parallel. On the upper and the lower sides of these two gate electrodes 15, a p$^+$ diffused region 21 is formed respectively, while between these two electrodes 15, a common p$^+$ diffused region 22 is formed, thus constructing two pMOS transistors. The p$^+$ diffused region 21 and the p$^+$ diffused region 22 may be called a p$^+$ source region 21 and p$^+$ drain region 22 respectively and vice versa, depending on the circuit configuration. As known in the art, the nMOS transistor and pMOS transistor is formed in symmetry, which n$^+$ diffused region or p$^+$ diffused region is called as the source region is a mere matter of naming. That is, each basic cell in the gate array configuration can make up two nMOS transistors and another two pMOS transistors.

In order to use such a layout of basic cell to construct a six-transistor memory cell in an SRAM such as shown in FIG. 2A, it is necessary to use two basic cells 301 and 302 as shown in FIG. 2B. In FIG. 2B, between the basic cell 301 shown on the upper side and the basic cell 302 shown on the lower side, an n$^+$ contact region 31 for an n-well and also a p$^+$ contact region 32 for a p-well are disposed. These two basic cells 301 and 302 are used to form three nMOS transistors of N11, N12, and N13 as well as three pMOS transistors of P11, P12, and P13. On these two basic cells, an SRAM cell is constructed, and a plurality of SRAM cells, each of which is constructed of six transistors, has been disposed on an LSI chip to form an X-Y matrix. Note here that signal names WB, RB, WW, and RW stand for Write Bit, Read Bit, Write Word, and Read Word respectively.

The nMOS transistor N11 has its n$^+$ source region 25 connected via a contact hole 66 to a WB wiring 55 at first metal level, while the nMOS transistors N12 and N13 have their respective n$^+$ source regions connected through the contact hole 66 to a low-voltage power supply (VSS) wiring 52 at first metal level. Also, a gate electrode 16 of the nMOS transistor N11 is connected to a WW wiring 54 at second metal level through via hole 88, first metal level wiring and contact hole 66. The first metal level wiring is formed just under the via hole 88 and not shown in FIG. 2B. On the other hand, the pMOS transistor P11 has its p$^+$ source region 21 connected to an RB wiring 51 at first metal level and also the pMOS transistors P12 and P13 have their respective p$^+$ source regions 21 connected to a high-level power supply at first metal level (VDD) wiring 56 through the contact hole 66 respectively. Also, a gate electrode 15 of the pMOS transistor P11 is connected to an RW wiring 53 at second metal level through via hole 88, first metal level wiring and the contact hole 66. The first metal level wiring is formed just under the via hole 88 and not shown in FIG. 2B.

As shown in FIG. 2B, the conventional type of a semiconductor IC memory has been implemented with a six-transistor/memory-cell configuration of an SRAM type, so that two basic cells of 301 and 302 have been required to configure each memory cell with three nMOS transistors and another three pMOS transistors. Therefore, the integration density has been very hard to increase and the memory capacity also has been restricted as a matter of course. Moreover, this conventional type is rather hard to manufacture because it takes six transistors for each memory cell and therefore has a complicated wiring.

As described so far, in a conventional gate array LSI, a plurality of SRAM cells each of which is constructed of six transistors has been disposed. And only the SRAM cell is known, while DRAM type cell is not developed, because the layout of the basic cells in the gate array LSI is considered being not suited for DRAM cells. Especially, it was difficult to construct a storage capacitor having an enough capacitance for the DRAM cell by the gate array layout.

SUMMARY OF THE INVENTION

In view of those.conventional situations, an object of the present invention is to provide another type of memory cell than the SRAM cell employing the gate array configuration, thereby manufacturing a semiconductor memory in a shorter term with low production cost.

Another object of the present invention is to implement such a memory that is capable of non-destructive read-out operations employing the geometrical configuration of the basic cells with a simpler construction, thus increasing the integration density of the memory cell.

A further object of the present invention is to provide a gate array LSI comprising such semiconductor memories that have better data retention characteristics and a higher integration density.

A still further object of the present invention is to provide a gate array LSI having memory cells, each having a better driving capability, thereby constructing an LSI having a higher degree of on-chip integration.

To this end, the first feature of the present invention is that in the layout of this gate array LSI, a memory area in a logic circuit construction region on an LSI chip is constructed of n-blocks and p-blocks disposed alternately, and DRAM cells are formed on the n-type and p-type blocks, respectively. That is, the first feature is that n-blocks comprising therein a sequence of DRAM cells each of which consists of only at least three nMOS transistors and p-blocks comprising therein a sequence of DRAM cells each of which consists of only at least three pMOS transistors are disposed alternately. The memory area is disposed at least on a part of the logic circuit construction region.

Here, the three pMOS transistors may be write select pMOS transistor, a sense pMOS transistor whose gate is connected to a drain of the write select pMOS transistor, and a read select pMOS transistor whose drain is connected to a drain of the sense pMOS transistor. And the three nMOS transistors may be a write select nMOS transistor, a sense nMOS transistor whose gate is connected to a drain of the write select nMOS transistor, and a read select nMOS transistor whose drain is connected to a drain of the sense nMOS transistor. Some other transistors can be added to the three pMOS and three nMOS transistors to form DRAM cell.

In the first feature of the present invention, a p-block write bit (WB) wiring may be connected to the write select pMOS transistor's source region, a low-voltage power supply (VSS) wiring may be connected to the sense pMOS transistor's source region, a p-block read bit (RB) wiring may be connected to the read select pMOS transistor's source region, a p-block read word (RW) wiring may be connected to the read select pMOS transistor's gate electrode, a p-block write word (WW) wiring may be connected to the write select pMOS transistor's gate electrode. And an n-block WB wiring may be connected to the write select nMOS transistor's source region, the VSS wiring may be connected to the sense nMOS transistor's source region, an n-block RB wiring may be connected to the read select nMOS transistor's source region, an n-block RW wiring may be connected to the read select nMOS transistor's gate electrode, and an n-block WW wiring may be connected to the write select nMOS transistor's gate electrode. Further, it is preferable that the p-block WW wiring and the p-block RW wiring are connected to a p-block row decoder, the p-block RB wiring is connected to a p-block sense-amplifier. And the n-block WW wiring and the n-block RW wiring are preferably connected to an n-block row decoder, and the n-block RB wiring may be connected to an n-block sense-amplifier.

According to the first feature of the present invention, the gate array LSI has a memory area consisting of two blocks, each of which consists of the sequence of nMOS transistor cells and pMOS transistor cells respectively, so that the alternate columns of the n-blocks and the p-blocks each having a sequence of basic cells can be effectively employed to reduce dead space, thus increasing the memory capacity. And the first feature of the present invention can achieve the effectiveness of prompt manufacturing of semiconductor memory at low cost.

The second feature of the present invention is a gate array LSI in which a memory area in a logic-circuit construction region on an LSI chip has therein a plurality of columns each of which combines a p-block to dispose therein a plurality of pMOS transistors and an n-block to dispose therein a plurality of nMOS transistors. Moreover, each of those columns disposes in it a sequence of DRAM cells each of which consists of at least three transistors. Those three transistors here refer to a write select transistor, a sense transistor, and a read select transistor respectively. Some other transistors may be added to them. For example, a pMOS transistor which acts as a write select transistor may be disposed in the p-block and two nMOS transistors which act as a sense transistor and a read select transistor respectively may be disposed in the n-block, and also may this conductivity be reversed in construction.

According to the second feature of the present invention, such a pattern layout can be effectively utilized that disposes therein a plurality of columns each of which consists of a pair of a p-block and an n-block, thus increasing the integration density as well as the memory capacity. Further the second feature of the present invention has advantages of short manufacturing term as well as the lower design cost or production cost.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employment of the invention in practice.

BRIEF DESCRIPTION OF THE DRAWINGS

FIG. 8B is a plan view of a DRAM related to the third embodiment of the present invention;

FIG. 12B is a plan view of a DRAM cell related to the fifth embodiment of the present invention;

FIG. 12C is a plan view of an example of a matrix construction made of memory cells shown in FIG. 12B;

DETAILED DESCRIPTION OF THE EMBODIMENTS

Figure 1:
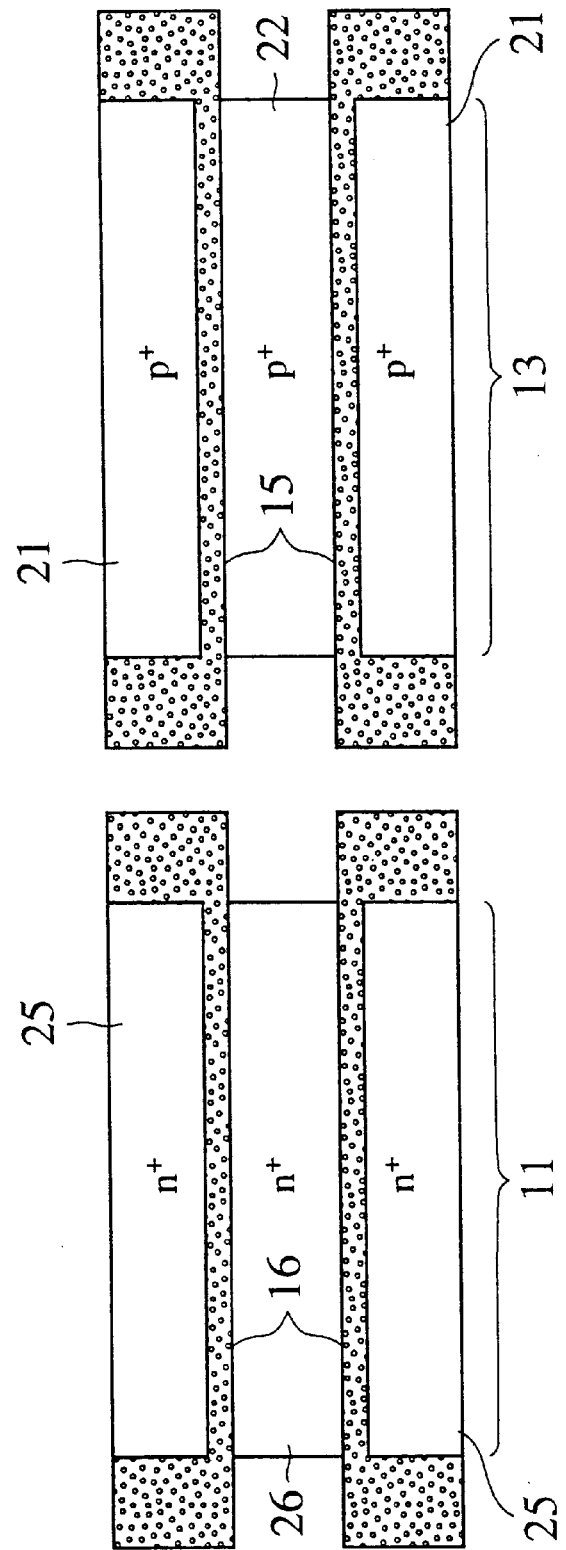
FIG. 1 is a pattern of a basic cell to construct a gate array LSI.
Figure 2A:
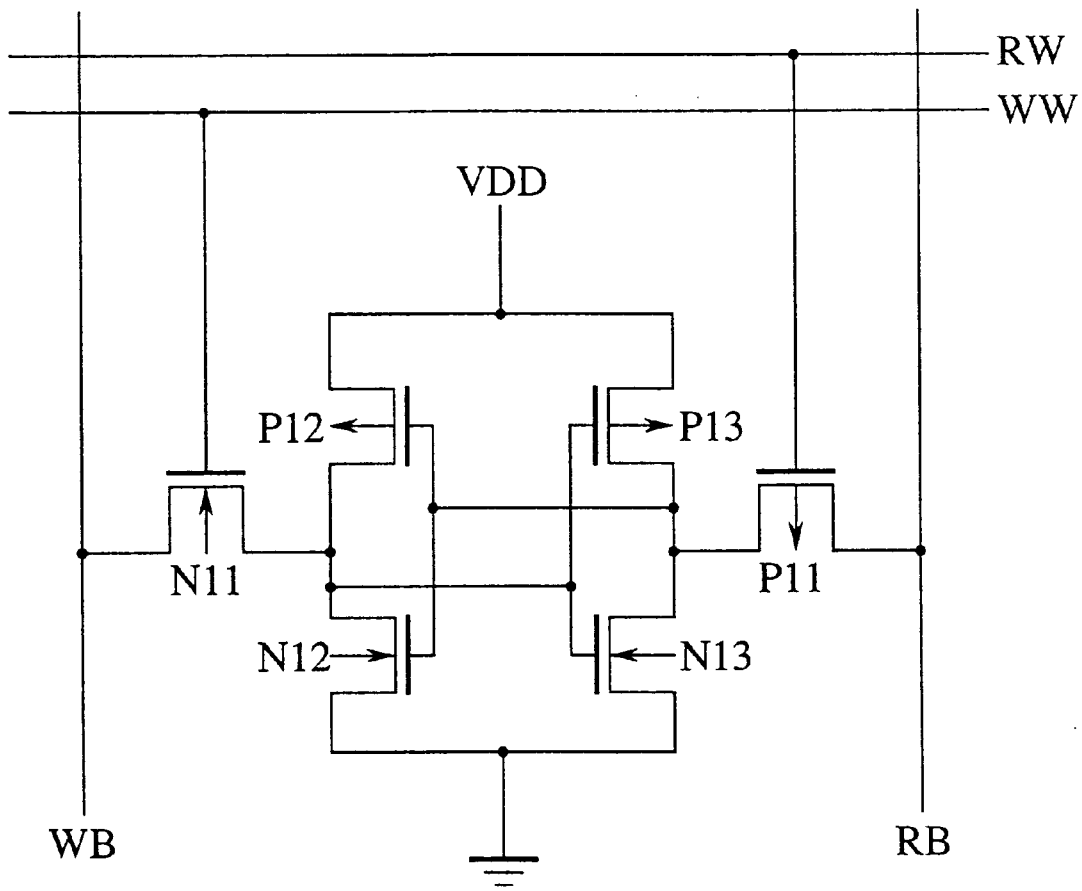
FIG. 2A is a circuit diagram of a conventional six-transistor memory cell of SRAM type.
Figure 2B:
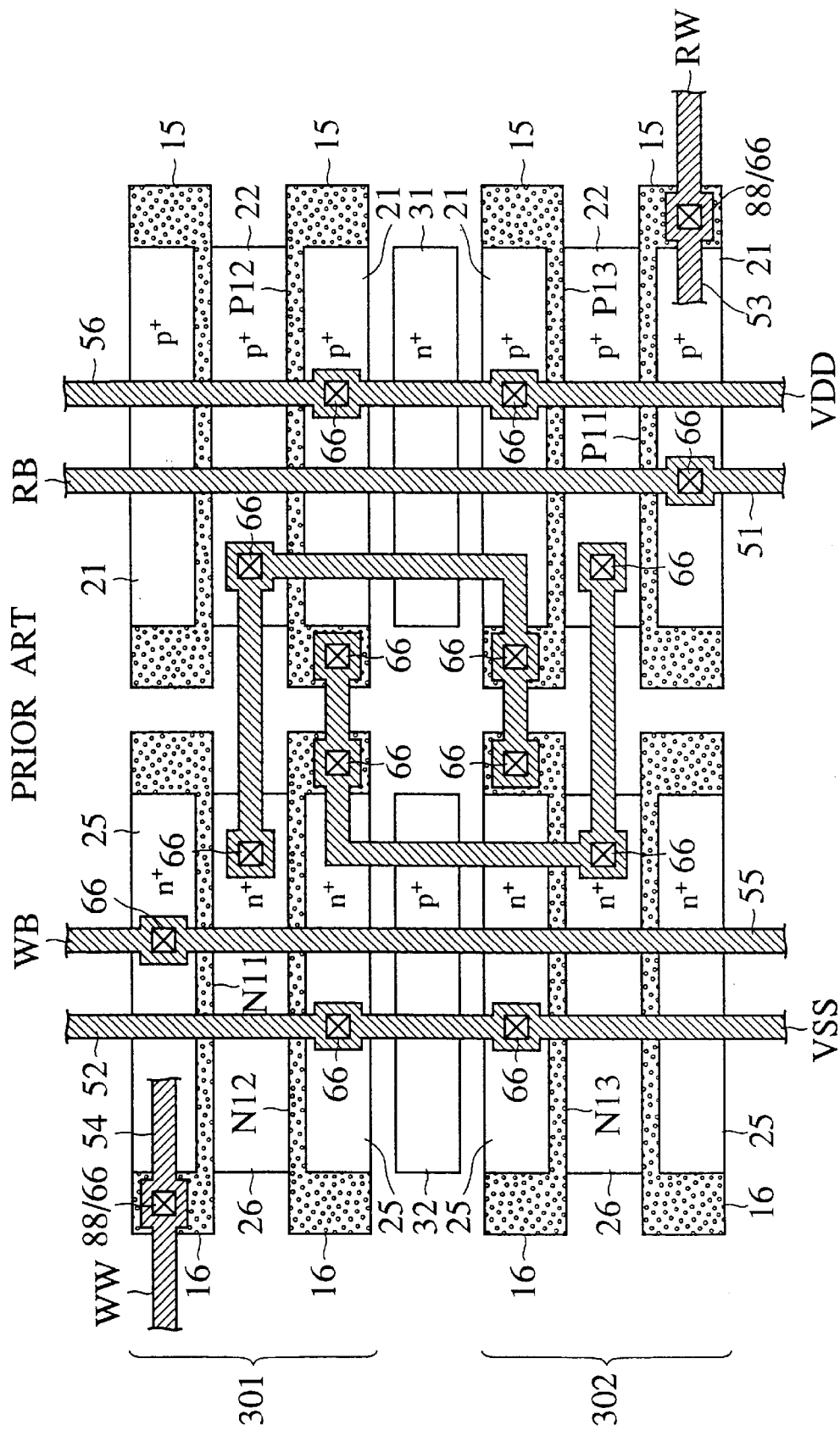
FIG. 2B is a plan view of a six-transistor memory cell of SRAM type constructed in the conventional basic cell.

Various embodiments of the present invention will be described with reference to the accompanying drawings. It is to be noted that the same or similar reference numerals are applied to the same or similar parts and elements through the drawings, and the description of the same or similar parts and elements will be omitted or simplified. Note also that the signal names WB, RB, WW, and RW stand for Write Bit, Read Bit, Write Word, and Read Word respectively.

First Embodiment

Figure 3:
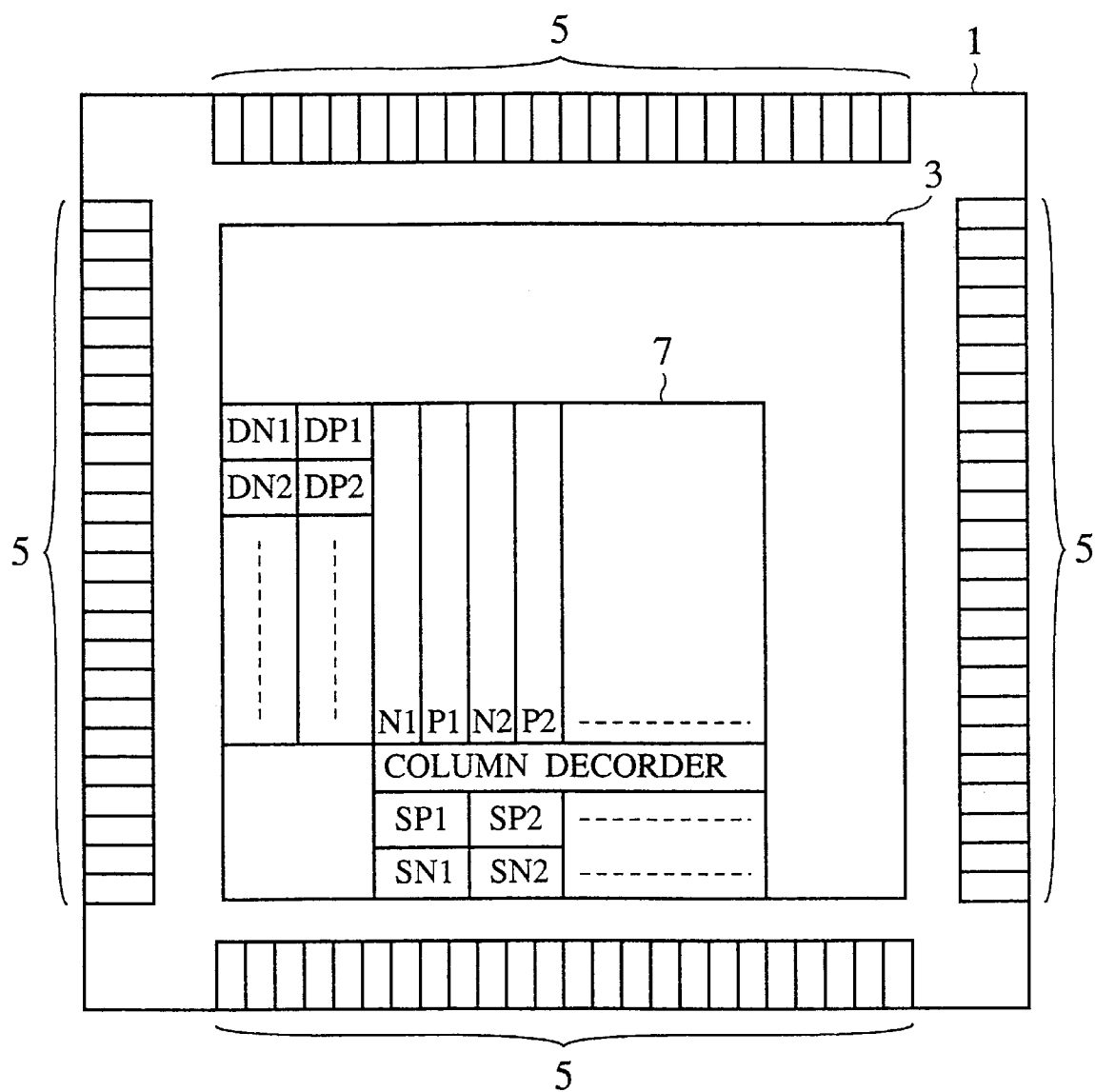
FIG. 3 is plan view outlining a pattern lay-out on an LSI chip in the first embodiment of the present invention.

FIG. 3 is a plan view outlining a pattern lay-out of a gate array LSI related to the first embodiment of the resent invention. In the middle of the semiconductor chip 1 (LSI chip 1) is disposed a logic-circuit construction region 3, which is surrounded by an I/O cell region 5. Further, the logic-circuit construction region 3 disposes in it a memory area 7, in which a plurality of basic cells are disposed. And the fact that the pattern lay-out in the memory area 7 is effectively utilized provides a feature of the first embodiment of the present invention. That is, in the memory area 7, n-blocks N1, N2, . . . , and Nn each of which can dispose therein a sequence of nMOS memory cells and p-blocks P1, P2 . . . , and Pn each of which can dispose therein a sequence of pMOS memory cells are disposed alternately.

Figure 4A:
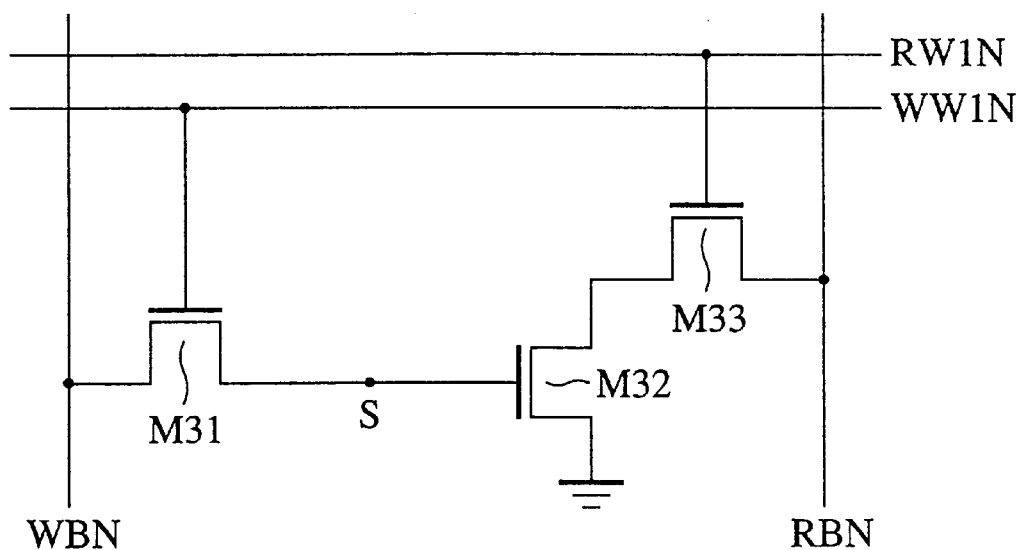
FIG. 4A is a circuit diagram of a DRAM in an n-block related to the first embodiment of the present invention.
Figure 4B:
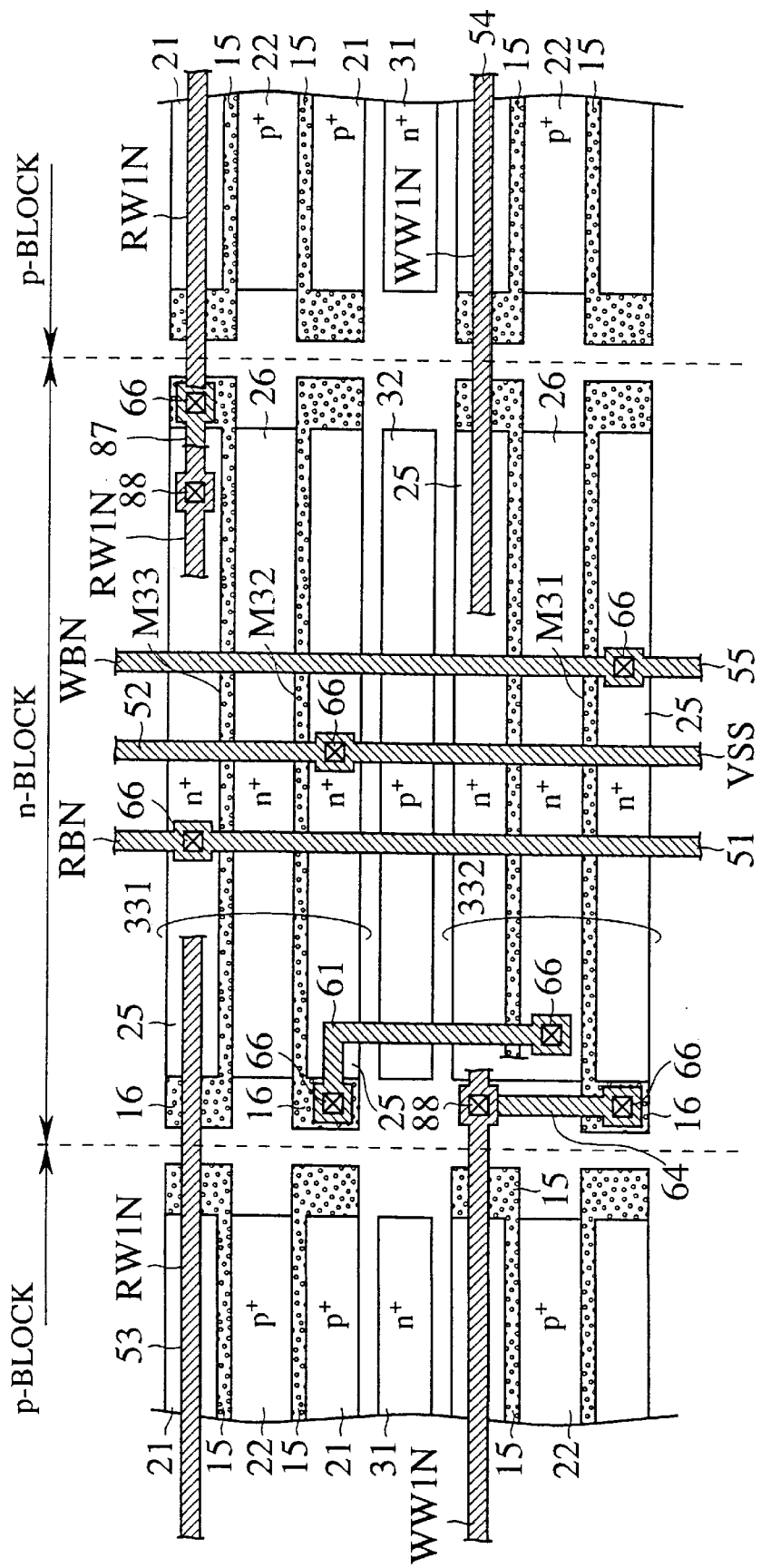
FIG. 4B is a plan view of a DRAM cell in an n-block related to the first embodiment of the present invention.
Figure 4C:
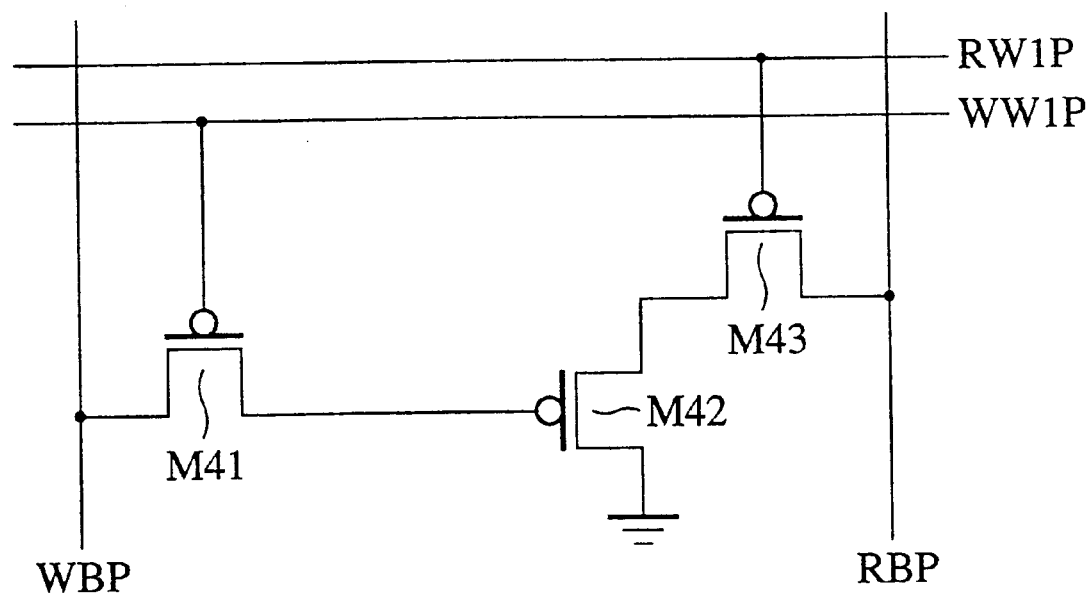
FIG. 4C is a circuit diagram of a DRAM in a p-block related to the first embodiment of the present invention.
Figure 4D:
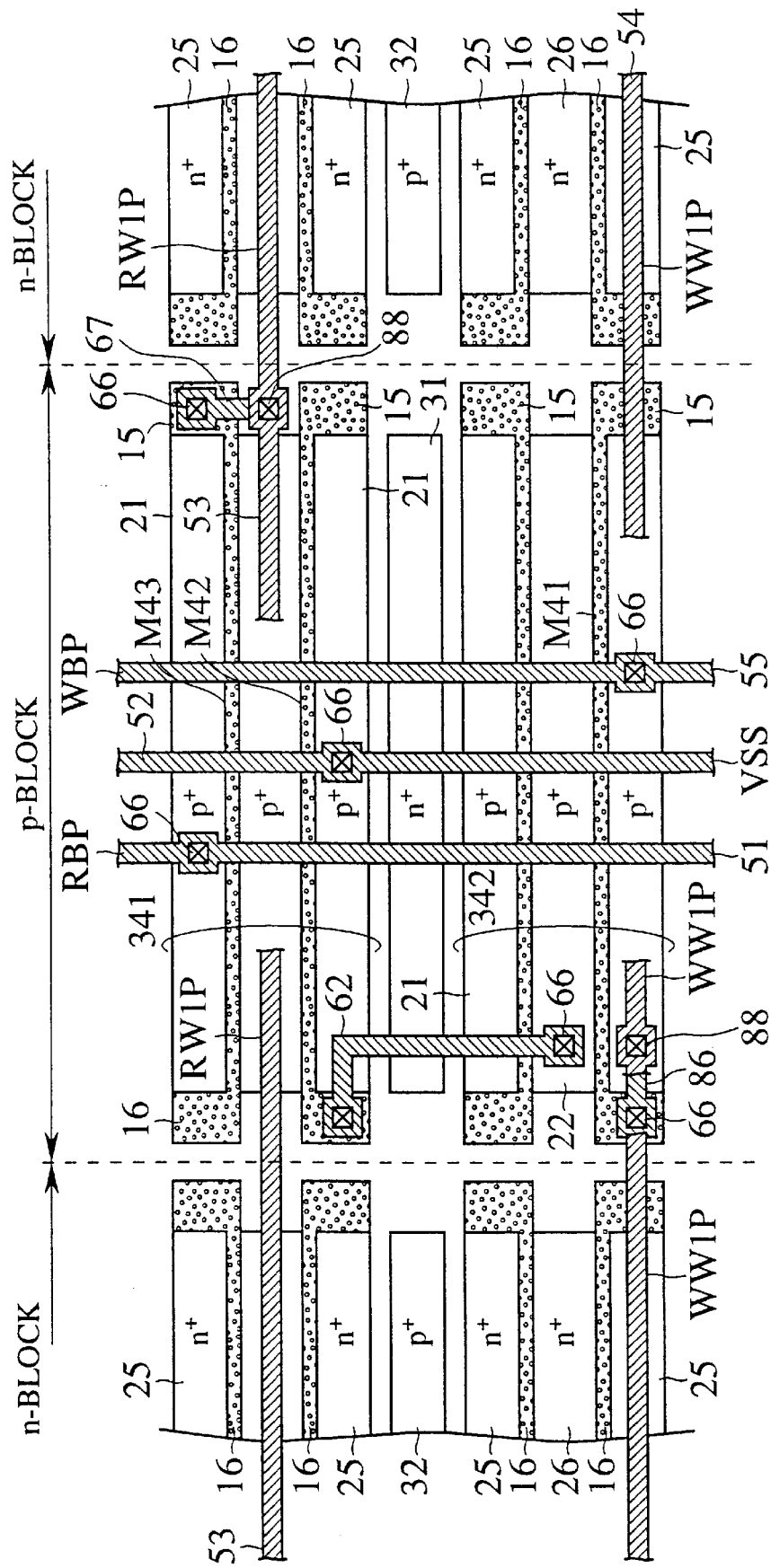
FIG. 4D is a plan view of a DRAM cell in a p-block related to the first embodiment of the present invention.

Those n-blocks for nMOS memory cells and p-blocks for pMOS memory cells are made up of a plurality of basic cells disposed in parallel to each other as shown in FIG. 1. In each of those n-blocks, a sequence of three-transistor DRAM cells, each cell is constructed of only nMOS transistors such as shown in FIG. 4B is disposed. While in each of those p-blocks, a sequence of three-transistor DRAM cells, each cell is constructed of only pMOS transistors such as shown in FIG. 4D, is disposed. FIGS. 4A and 4C are circuit representations of FIGS. 4B and 4D respectively. This lay-out enables effective utilization of the memory cell area 7 (see, FIG. 3) in which n-blocks and p-blocks are disposed alternately, thus improving the integration density over the conventional six-transistor SRAMs.

In each n-block, a sequence of three-transistor DRAM cells such as shown in FIGS. 4A and 4B are formed to implement a one-dimensional cell array, each DRAM cell consists of two basic cells 331 and 332. That is, an nMOS transistor M31 which acts as a write select transistor has its $n^+$ source region 25 connected to a WBN wiring 55 through contact hole 66. The gate electrode of the nMOS transistor M31 is connected to a wiring 64 at first metal level through contact hole 66, and the wiring 64 is connected to a WW1N wiring 54 at second metal level through via hole 88. The WW1N wiring 54 runs perpendicular to the WBN wiring 55. The WBN wiring 55 is connected to the columns decoder and the WW1N wiring 54, to the n-block row decoder DN1. This nMOS transistor M31 has also its $n^+$ drain region 26 connected through a wiring 61 to a gate electrode 16 of an nMOS transistor M32 which acts as a sense transistor. The nMOS transistor M32 has its $n^+$ source region 25 connected through a contact hole 66 to a low-voltage power supply (VSS) wiring 52. An nMOS transistor M33 which acts as a read select transistor is connected via its common $n^+$ drain region 26 to the nMOS transistor M32, and also does it have its $n^+$ source region 25 connected respectively to an RBN wiring 51 through a contact hole 66. The gate electrode 16 is connected to a wiring 87 at first metal level through contact hole 66, and the wiring 87 is connected to an RW1N wiring 53 at second metal level through via hole 88. The RBN wiring 51 is connected to the n-block sense-amplifier SN1 and the RW1N wiring 53, to the n-block row decoder DN1. The RW1N wiring 53 runs perpendicular to the RBN wiring 51. A potential level at a node S shown in FIG. 4A determines whether the sense transistor M32 is conducted or not. This conductive/non-conductive state of the sense transistor M32 is read out by the read select transistor M33 and then sent via the RBN wiring to the n-block sense-amplifier SN1, thus enabling non-destructive read-out operation. The RBN wiring 51, VSS wiring 52, and WBN wiring 55 are formed at first metal level and the RW1N wiring 53 and WW1N wiring 54 are formed at second metal level. The first and second metal levels are mutually isolated by an interlayer insulating film.

The nMOS transistor M31 is formed in a basic cell 332 and the nMOS transistors M32 and M33 are formed in a basic cell 331, to make up a memory cell. Thus constructed emory cells are disposed vertically to form a linear memory cell array. This sequence of such memory cells make up each n-block. And, a plurality of such n-blocks (N1, N2, . . . ) are disposed to construct a two dimensional memory-cell matrix using nMOS transistors. The RBN wirings of those n-blocks are connected to n-block sense-amplifier SN1, SN2, . . . , and SNn.

A p-block, on the other hand, is made up of a sequence of three-transistor DRAM cells, such as shown in FIGS. 4C and 4D to implement another one-dimensional cell array. Each DRAM cell is formed in basic cells 341 and 342 respectively. That is, a pMOS transistor M41 which acts as a write select transistor has its $p^+$ source region 21 connected to the WBP wiring 55 through contact hole 66. The gate electrode 15 is connected to a wiring 86 at first metal level through contact hole 66, and the wiring 86 is connected to a WW1P wiring 54 at second metal level through via hole 88. The WW1P wiring 54 runs perpendicular to the WBP wiring 55. The WBP wiring 55 is connected to the column decoder and the WW1P wiring 54, to the p-block row decoder DP1. The pMOS transistor M41 has also its p+ drain region connected via a wiring 62 to the gate electrode 15 of a pMOS transistor M42 which acts as a sense transistor. This pMOS transistor M42 has its p+ source region 21 connected through a contact hole 66 to the VSS wiring 52. A pMOS transistor M43 which acts as a read select transistor is connected via its common p+ drain region 22 to the pMOS transistor M42, and also does it have its p+ source region 21 connected to the RBP wiring 51 through contact hole 66. The gate electrode 15 of the pMOS transistor M43 is connected to a wiring 67 at first metal level through contact hole 66, and the wiring 67 is connected to RW1P wiring 53 at second metal level through via hole 88. The RBP wiring 51 is connected to the p-block sense-amplifier SP1 and the RW1P wiring 53, to the p-block row decoder DP1. The RW1P wiring 53 runs perpendicular to the RBP wiring 51. With this, the read select transistor M43 reads out the conductivity/non-conductivity state of the sense transistor M42 and sends it as read-out data via the RBP wiring 51 to the p-block sense-amplifier, thus enabling non-destructive read-out operations. The RBP wiring 51, VSS wiring 52, and WBP wiring 55 are formed at first metal level and the RW1P wiring 53 and WW1P wiring 54 are formed at second metal level. The first and second metal levels are mutually isolated by an interlayer insulating film.

The pMOS transistor M41 is formed in the basic cell 342 and the pMOS transistors M42 and M43 are formed in the basic cell 341, thus constructing a memory cell. Thus constructed memory cells are vertically arranged to form the one-dimensional memory cell array in each column, making up the p-block. A plurality of thus constructed p-blocks (P1, P2, . . . ) are disposed to construct another two-dimensional memory-cell matrix using pMOS transistors. The RBP wirings of the p-blocks are connected to the p-block sense-amplifiers SP1, SP2, . . . , and SPn respectively.

Figure 5A:
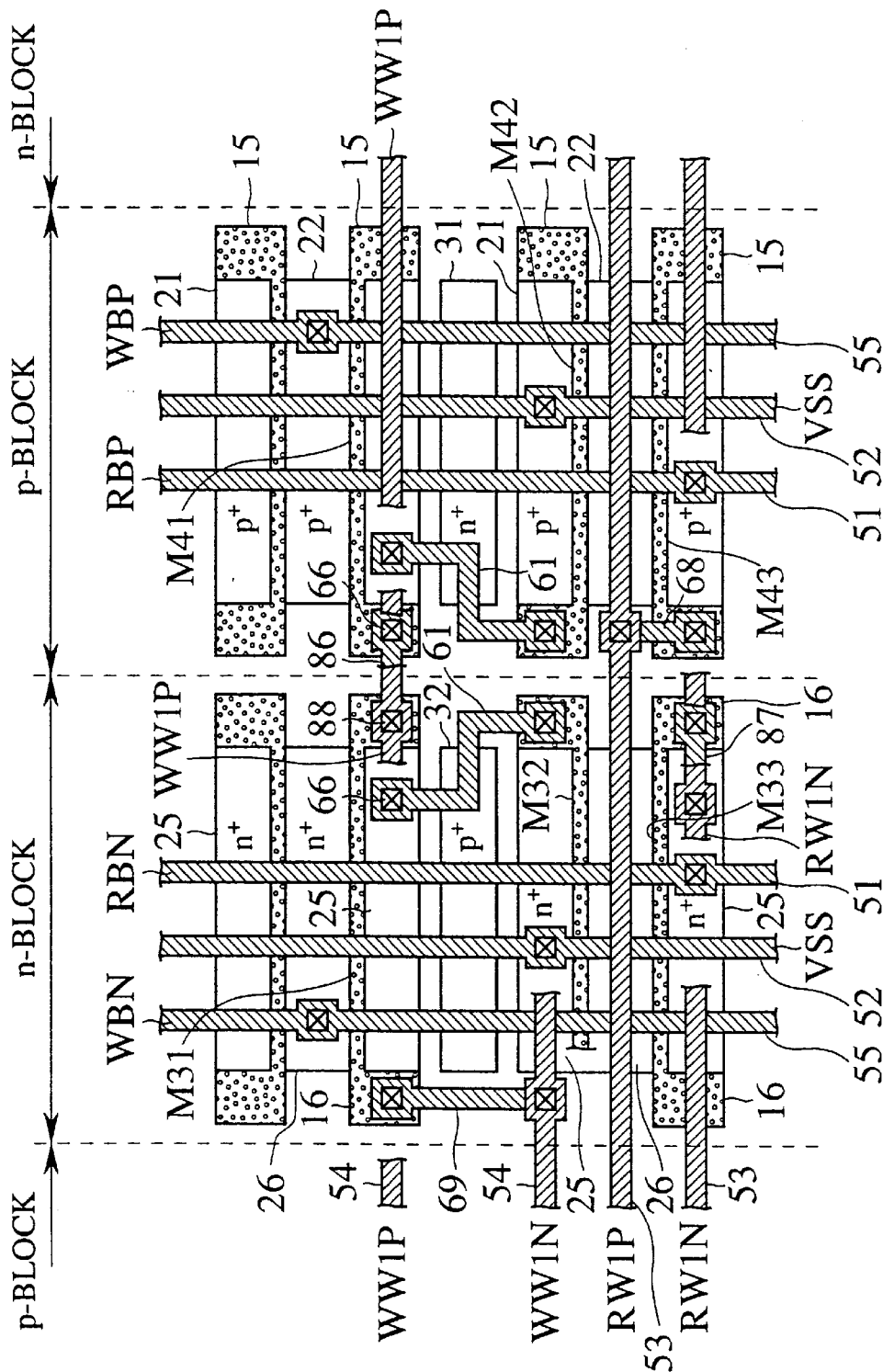
FIG. 5A is a plan view of two DRAM cells, in which n-block memory cell and p-block memory cell are arranged side by side in the first embodiment of the present invention.

FIG. 5A is a plan view of two DRAM cells, showing n-block memory cells and p-block memory cells disposed adjacent to each other. The memory cells shown in FIG. 5A are basically the same as those shown in FIGS. 4B and 4D. FIG. 5A is different from FIGS. 4B and 4D in that the nMOS transistor M31 has its n+ drain region 26 connected with the WBN wiring 55 and its n+ source region 25 connected with the gate electrode 16 of the nMOS transistor M32 through wiring 61, the pMOS transistor M41 has its p+ drain region 22 connected with the WBP wiring 55, and the pMOS transistor M41 has its p+ source region 21 connected with the gate electrode of the pMOS transistor M42 through wiring 61. In both the pMOS and nMOS transistors formed in basic cells, their source regions and drain regions are provided symmetrically, so that they are exchangeable in function. Then the n+ diffused region 26 and the n+ diffused region 25 can be called as the n+ source region 26 and the n+ drain region, respectively. The nomenclature as to "the source/drain region" does not change the essence of the present invention. Similarly, the DRAM cells show in FIGS. 4B and 4D can be arranged side by side as shown in FIG. 5A.

Figure 5B:
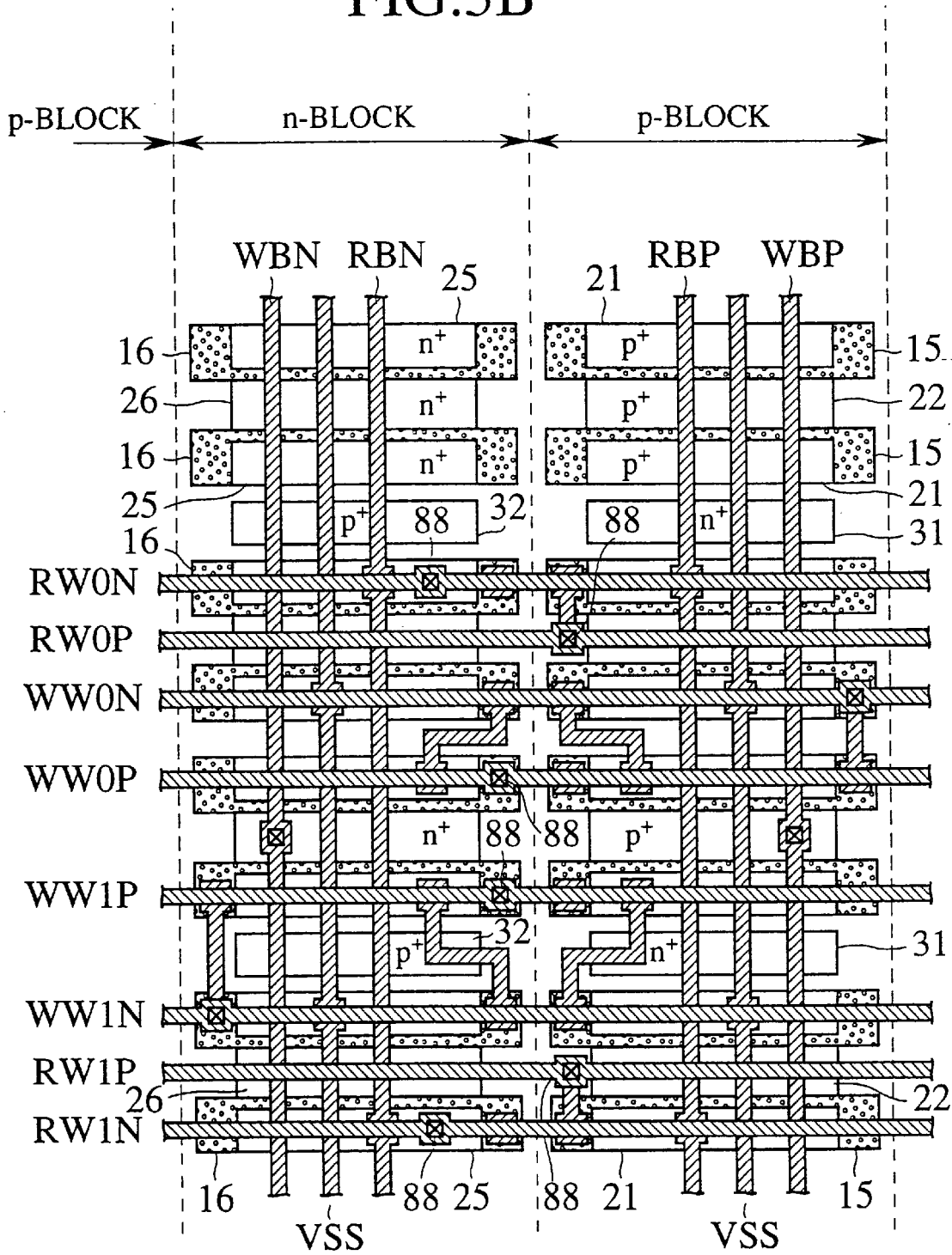
FIG. 5B is a plan view of an example of 2-by-2 matrix made of two DRAM cells shown in FIG. 5A.

FIG. 5B is a plan view of a 2-by-2 matrix of memory cells shown in FIG. 5A. In a cross-point array shown in FIG. 5B, a desired single DRAM cell in n-block is addressed at the intersection of RBN and RW0N, RW1N wirings or WBN and WW0N, WW1N wirings. A desired single DRAM in p-block can be addressed at the intersection of RBP and RW0P, RW1P wirings or WBP and WW0P, WW1P wirings. By repeating such a cross-point array as shown in FIG. 5B, it is possible to realize, for example, 500-by-500 or 1000-by-1000 memory-cell matrices.

Second Embodiment

Figure 6A:
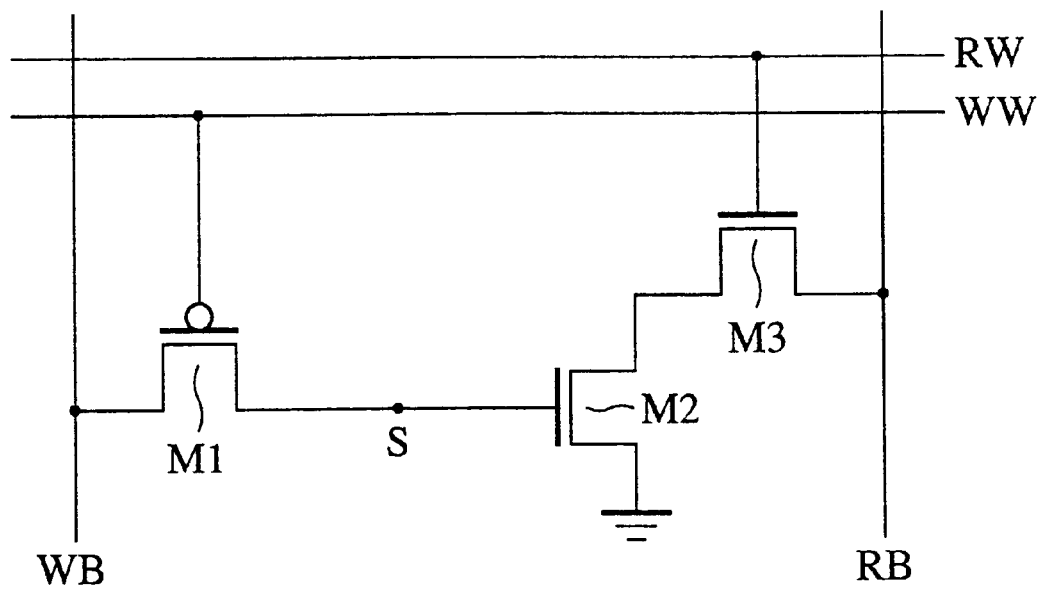
FIG. 6A is a circuit diagram of a DRAM related to the second embodiment of the present invention.
Figure 6B:
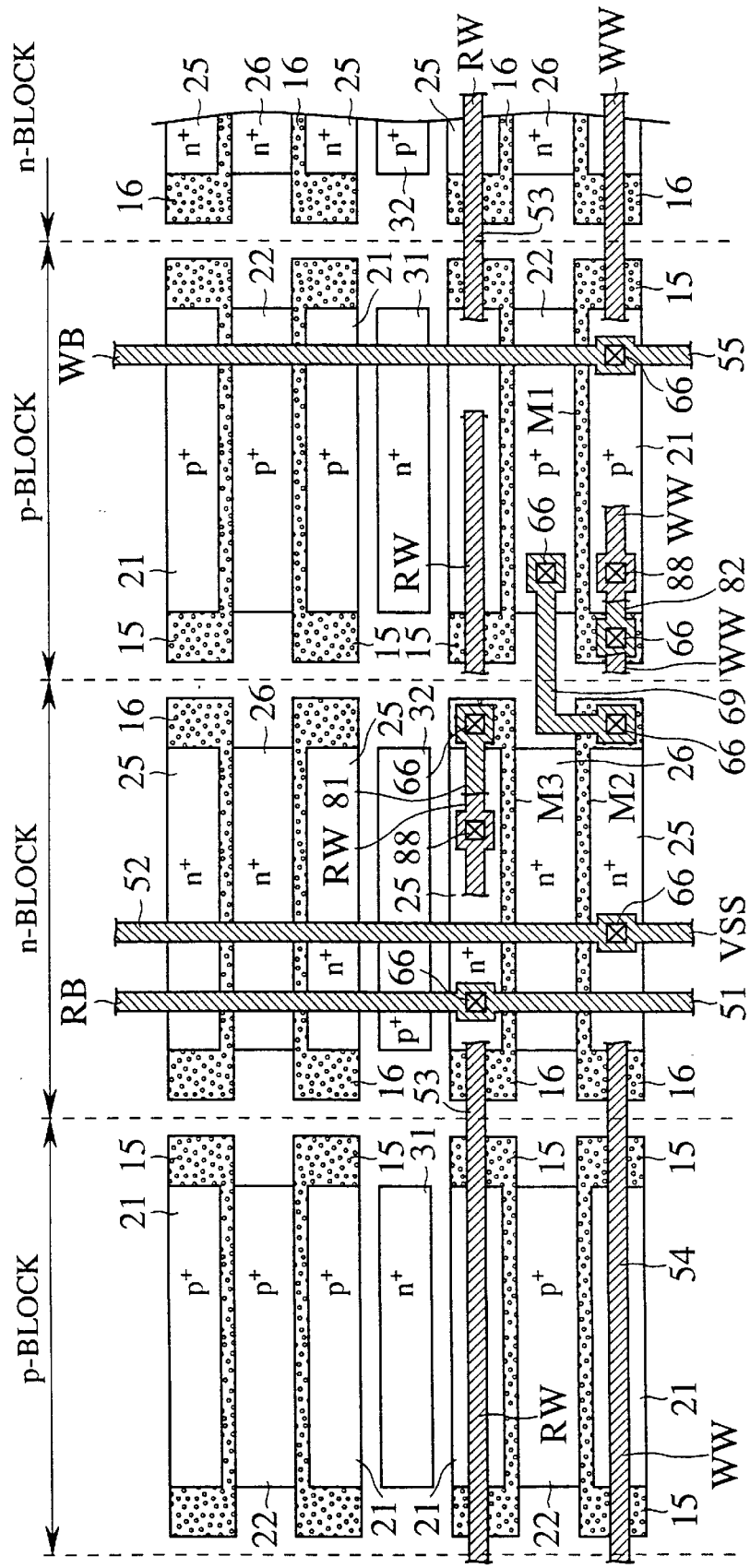
FIG. 6B is a plan view of a DRAM cell related to the second embodiment of the present invention.

The second embodiment of the present invention is described with reference to FIGS. 6A to 6C as follows. FIG. 6B is a plan view of memory cells realized by using basic cells in which such a three-transistor DRAM cell as shown in FIG. 6A is formed. As can be seen from FIGS. 6A and 6B, this three-transistor DRAM cell, consisting of two nMOS transistors M2 and M3 and one pMOS transistor M1, can be formed in one basic cell.

In FIG. 6B, the n+ source region 25 of the nMOS transistor M2 and that of the nMOS transistor M3 are respectively connected to the low-voltage power supply (VSS) wiring 52 and the RB wiring 51 via their respective contact holes 66. Also, the gate electrode 16 of the nMOS transistor M3 is connected to wiring 81 at first metal level through contact hole 66, and the wiring 81 is connected to the RW wiring 53 at second metal level through via hole 88. The RW wiring 53 runs perpendicular to the RB wiring 51. The p+ source region 21 of the pMOS transistor M1 is connected to the WB wiring 55 through contact hole 66. The gate electrode 15 of the pMOS transistor M1 is connected to wiring 82 at first metal level through contact hole 66, and the wiring 82 is connected to the WW wiring 54 at second metal level through via hole 88. The WW wiring 54 runs perpendicular to the WB wiring 55. Also, the p+ drain region 22 of the pMOS transistor M1 and the gate electrode 15 of the nMOS transistor M2 are interconnected via the wiring 69. The RB wiring 51, VSS wiring 52 and WB wiring 55 are formed at first metal level and the RW wiring 53 and WW wiring 54 are formed at second metal level. The first and second metal levels are mutually isolated by an interlayer insulating film.

The pMOS transistor M1 acts as a write select transistor, while the nMOS transistors M2 and M3 act as a sense transistor and a read select transistor respectively.

Figure 6C:
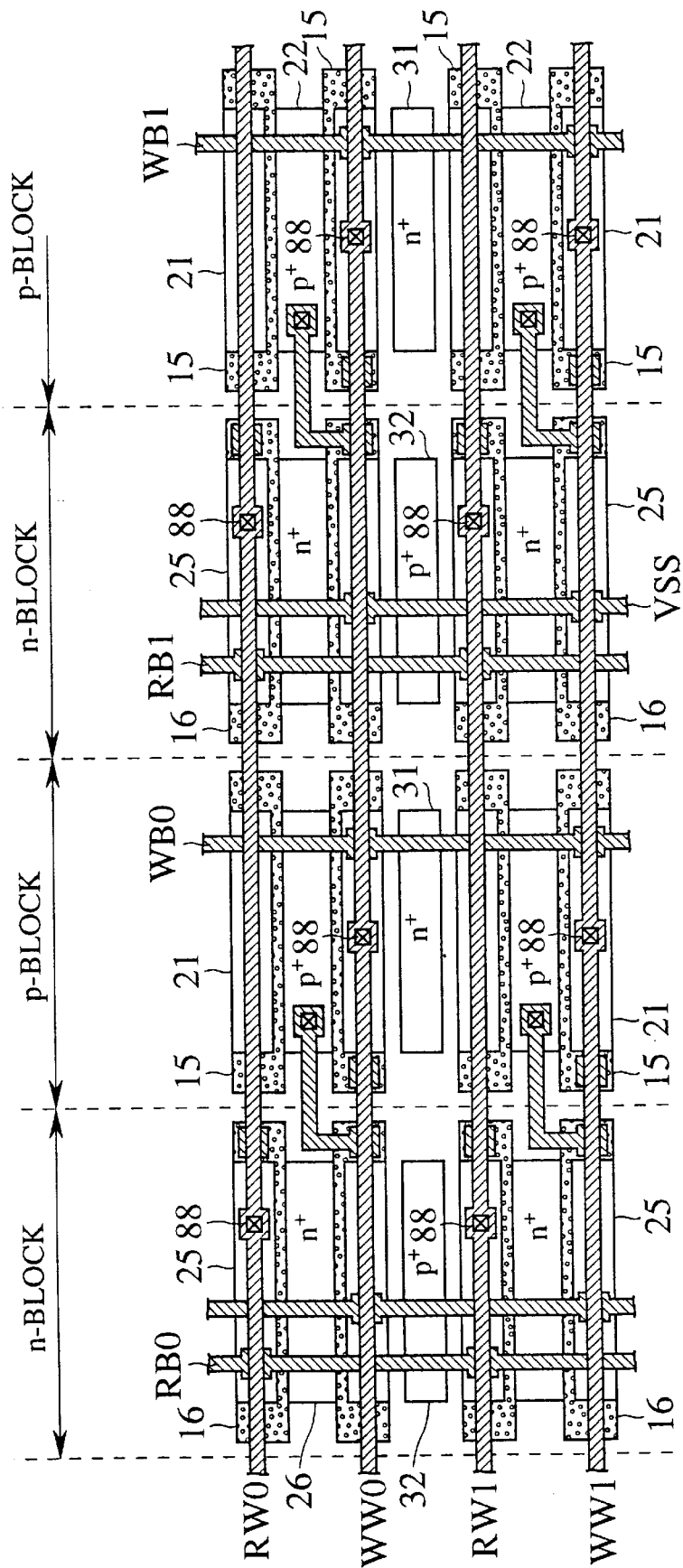
FIG. 6C is a plan view of an example of a matrix construction made of memory cells shown in FIG. 6B.

FIG. 6C shows an example of 2-by-2 matrix, in which a desired single DRAM cell being addressed at the intersection of RW0, RW1 and RB0, RB1 wirings or WW0, WW1 and WB0, WB1 wirings. By disposing a plurality of three-transistor DRAM cells described in the second embodiment of the present invention into a regular cross-point array as shown in FIG. 6C, it is possible to utilize effectively the memory area 7 (see, FIG. 3) having therein alternate n-blocks and p-blocks described in the first embodiment, thus providing promptly large memory-capacity LSIs with low production costs.

Figure 7A:
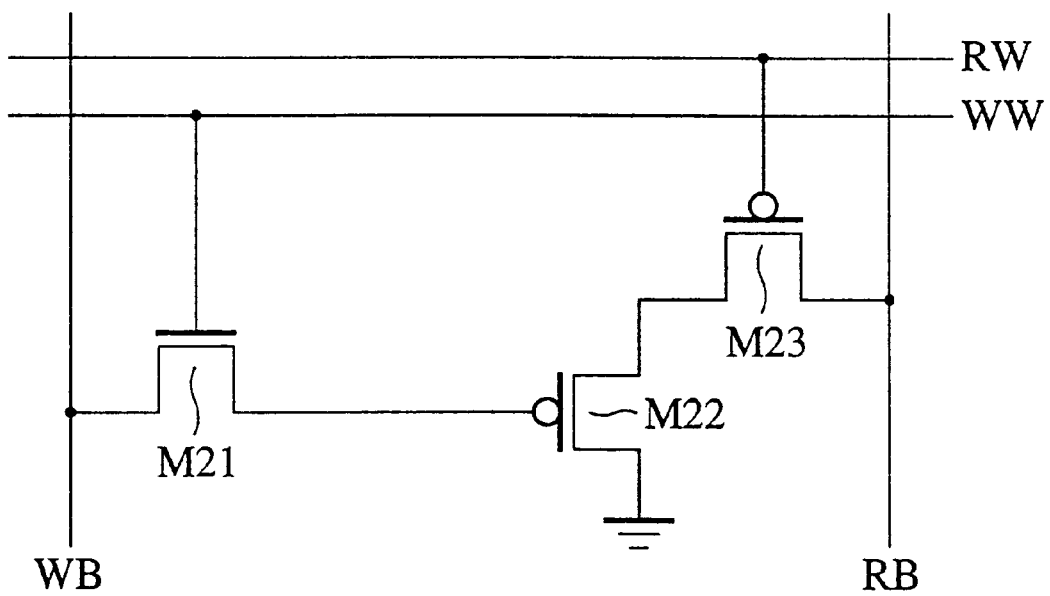
FIG. 7A is a circuit diagram of a DRAM related to a modification of the second embodiment of the present invention.

FIG. 7A is a circuit diagram focusing on a three-transistor DRAM cell related to a modification of the second embodiment of the present invention. In contrast to FIG. 6A where the single DRAM cell consists of two nMOS transistors M1 and M2 and one pMOS transistor M1, as shown in FIG. 7A, one nMOS transistor M21 and two pMOS transistors M22 and M23 are employed to form a single DRAM cell. That is, in FIG. 7A, the nMOS transistor M21 acts as a write select transistor, while the pMOS transistors M22 and M23 act as a sense transistor and a read select transistor respectively.

Figure 7B:
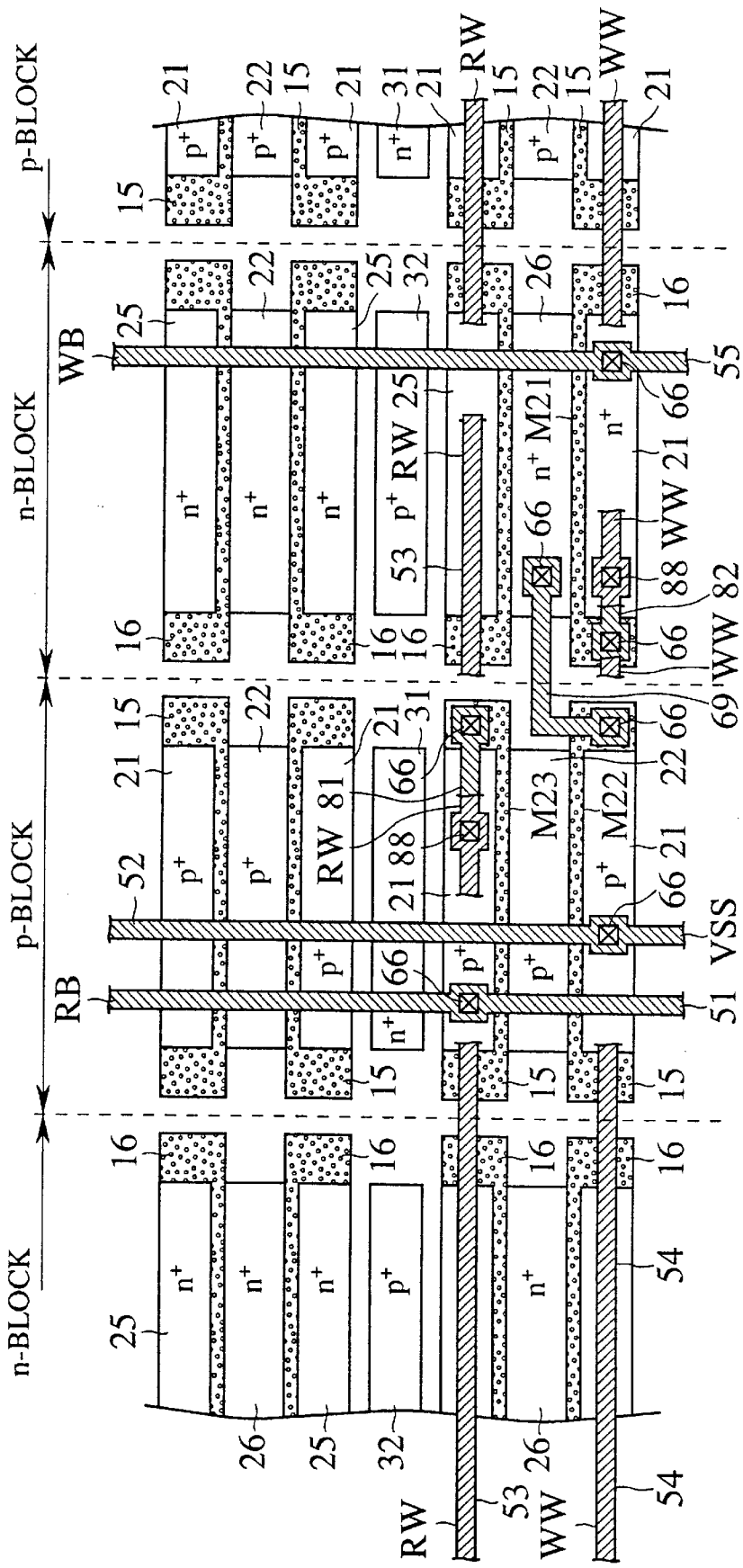
FIG. 7B is a plan view of a DRAM cell related to a modification of the second embodiment of the present invention.

FIG. 7B is a plan view of a gate-array representation of the circuit shown in FIG. 7A. In FIG. 7B, the p+ source region 21 of the pMOS transistor M22 and that of the pMOS transistor M23 are respectively connected to the VSS wiring 52 and the RB wiring 51 via their respective contact holes 66. The gate electrode 15 of the pMOS transistor M23 is connected to wiring 81 at first metal level through contact hole 66, and the wiring 81 is connected to the RW wiring at second metal level through via hole 88. The nMOS transistor M21, on the other hand, has its n⁺ source region 25 connected to the WB wiring 55 through contact hole 66. The gate electrode 16 of the nMOS transistor 21 is connected to wiring 82 at first metal level through contact hole 66, and the wiring 82 is connected to the WW wiring 54 at second metal. level through via hole 88. Also, the n⁺ drain region 26 of the nMOS transistor M21 and the gate electrode 15 of the pMOS transistor M22 are interconnected via the wiring 69.

Third Embodiment

Figure 8A:
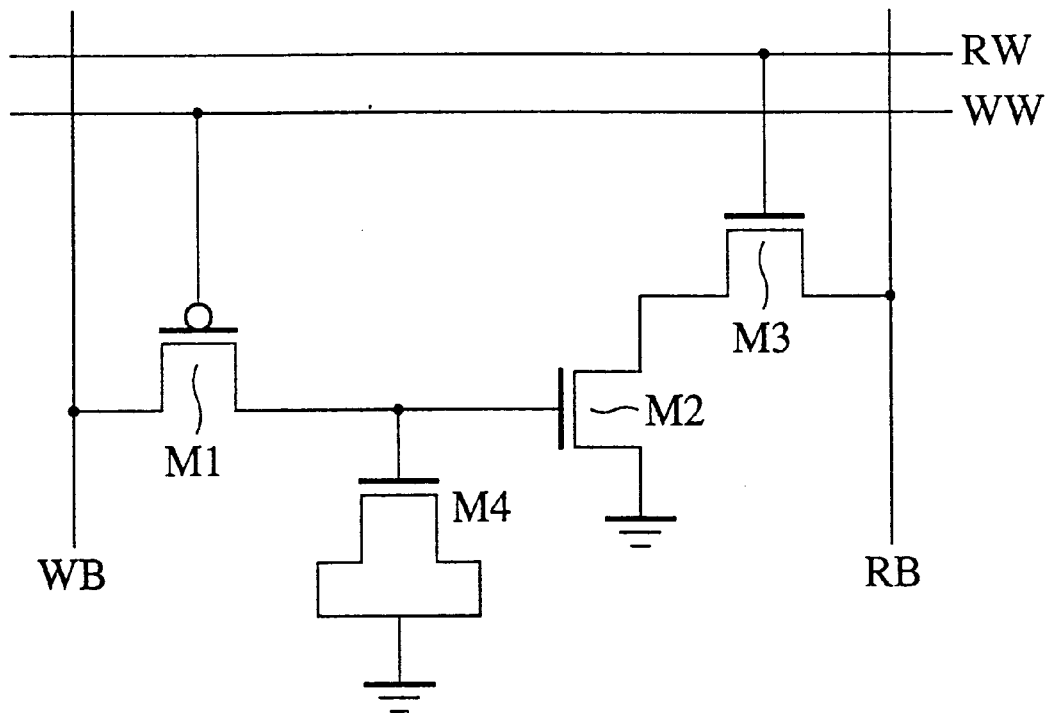
FIG. 8A is a circuit diagram of a DRAM related to the third embodiment of the present invention.

The third embodiment of the present invention is described with reference to FIGS. 8A to 8C as follows. As shown in FIG. 8A, the third embodiment consists of one three-transistor DRAM cell shown in FIG. 6A and a transistor M4 whose gate is connected to the drain of transistor M1. This gate connected configuration increases the capacitance of the storage capacitor of DRAM, or the gate capacitance of transistor M2, by the gate capacitance of transistor M4. This circuit construction shown in FIG. 8A is realized into such a memory cell as shown in FIG. 8B, which is formed in two basic cells 311 and 312.

In the basic cell 311 shown in FIG. 8B, two nMOS transistors M2 and M3 and one pMOS transistor M1 are formed. The pMOS transistor M1 acts as a write select transistor, while the nMOS transistors M2 and M3 act as a sense transistor and a read select transistor respectively. Also, in the basic cell 312 opposite to the basic cell 311 with n⁺ contact region 31 and p⁺ contact region 32 sandwiched therebetween is formed the nMOS transistor M4 which is connected to nMOS transistor M2 and pMOS transistor M1 at its gate electrode 16.

As shown in FIG. 8B, in the basic cell 311, the n⁺ source region 25 of the nMOS transistor M2 and that of the nMOS transistor M3 are respectively connected to the low-voltage power supply (VSS) wiring 52 and the RB wiring 51 via their respective contact holes 66. Also, the gate electrode 16 of the nMOS transistor M3 is connected to wiring 81 at first metal level through contact hole 66, and the wiring 81 is connected to the RW wiring 53 at second metal level through via hole 88. The RW wiring 53 runs perpendicualr to the RB wiring 51. The pMOS transistor M1 formed in the basic cell 311, on the other hand, has its p⁺ source region 21 connected to the WB wiring 55 through contact holes 66. The gate electrode 15 of the pMOS transistor M1 is connected to wiring 82 at first metal level through contact hole 66, and the wiring 82 is connected to the WW wiring 54 at second metal level through via hole 88. The WW wiring 54 runs perpendicular to the WB wiring 55. Also, in the same basic cell 311 are interconnected via a wiring 69 the p⁺ drain region 22 of the pMOS transistor M1 and the gate electrode 16 of the nMOS transistor M2 via wiring 69, which are also connected to the gate electrode of the nMOS transistor M4 formed in the basic cell 312 via a wiring 71. Both the n⁺ source region 25 and the n⁺ drain region 26 of the nMOS transistor M4 are connected to the VSS wiring 52. The RB wiring 51, VSS wiring 52 and WB wiring 55 are formed at first metal level and the RW wiring 53 and WW wiring 54 are formed at second metal level. The first and second metal levels are mutually isolated by an interlayer insulating film.

Figure 8C:
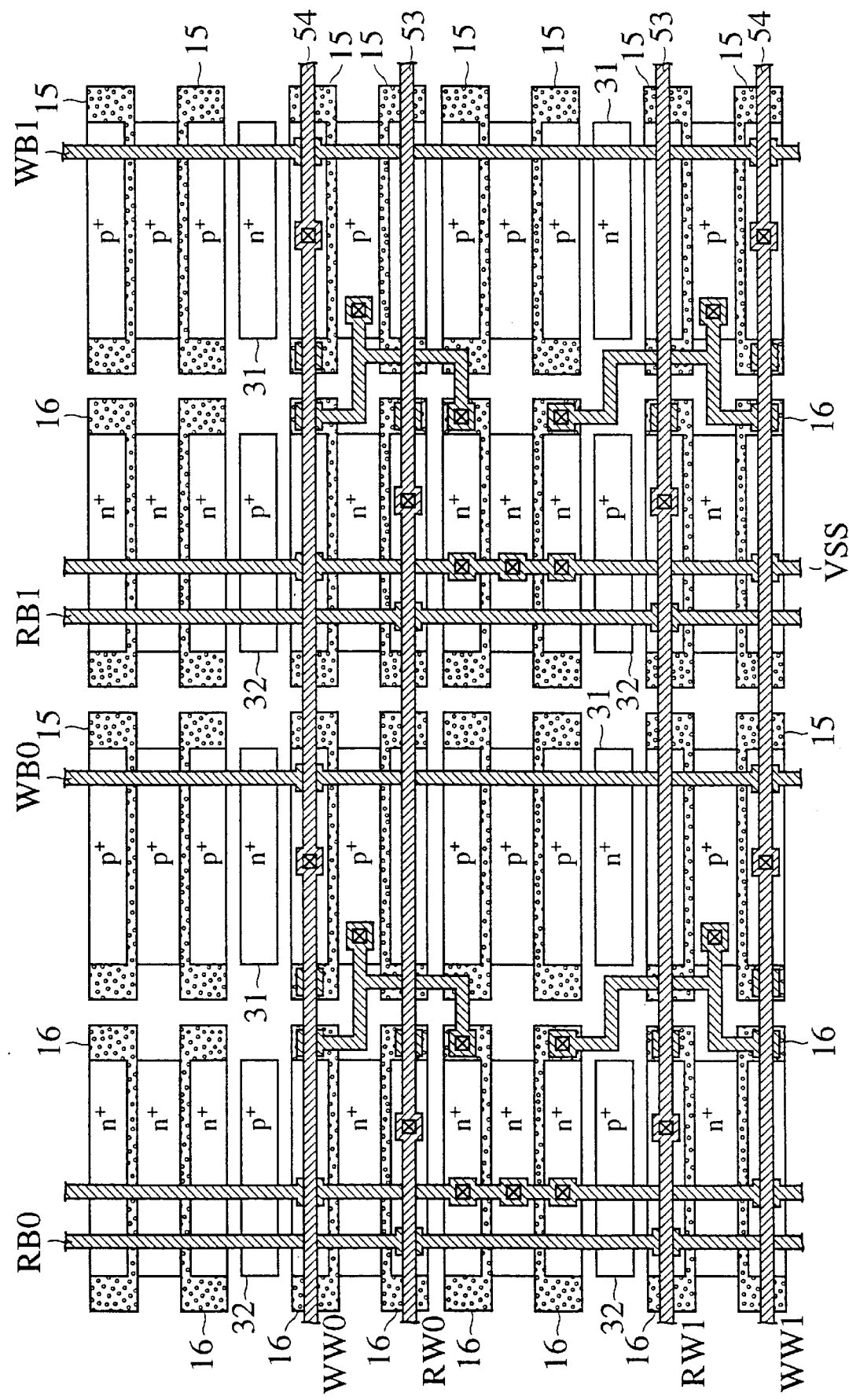
FIG. 8C shows an example of a matrix construction using memory cells shown in FIG. 8B.

FIG. 8C shows an example of 2-by-2 matrix, in which a desired single DRAM cell being addressed at the intersection of RW0, RW1 and RB0, RB1 wirings, or WW0, WW1 and WB0, WB1 wirings. By disposing a plurality of such memory cells as shown in FIG. 8B, it is possible to utilize such a memory area 7 in a logic-circuit construction region 3 (see, FIG. 3) which disposes therein n-blocks and p-blocks alternately. Moreover, this construction improves the effects of accumulating charge by use of the gate capacitance of the transistor M4, thus providing semiconductor memory with better data retention characteristics.

Figure 9A:
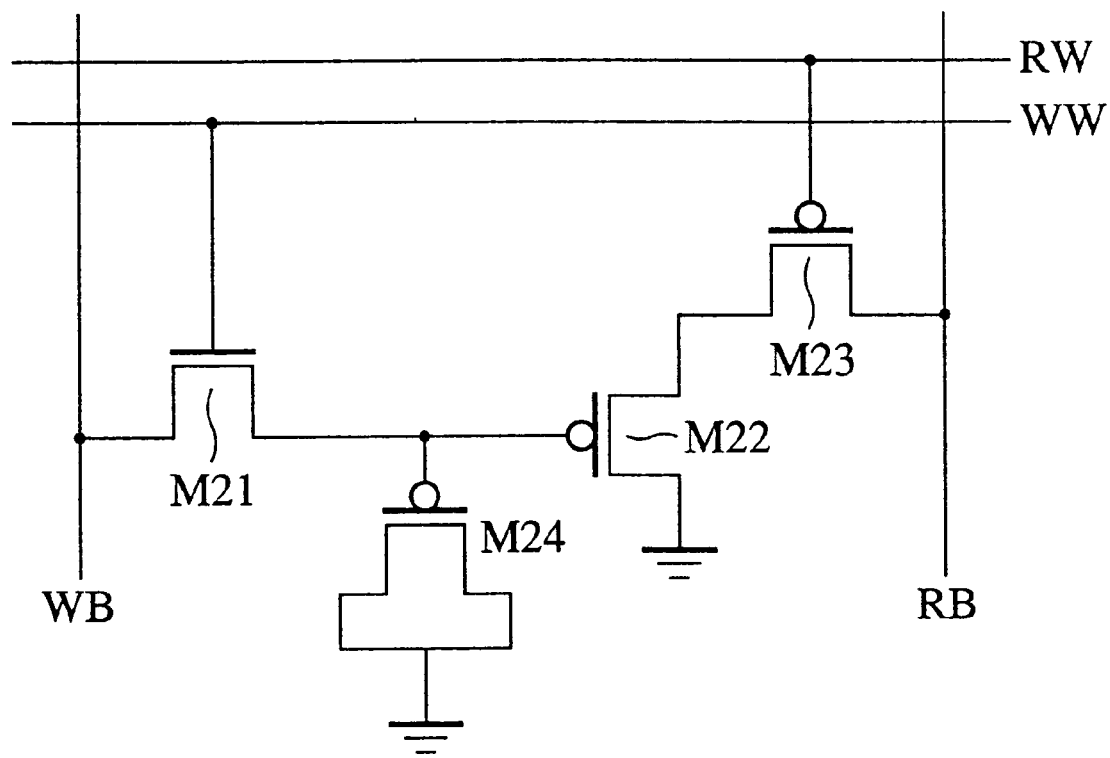
FIG. 9A is a circuit diagram of a DRAM related to a modification the third embodiment of the present invention.

As shown in FIG. 9A, it is also possible to make up a memory cell of one nMOS transistor M21, two pMOS transistors M22 and M23, and another pMOS transistors M24 which is connected to others at its gate.

Figure 9B:
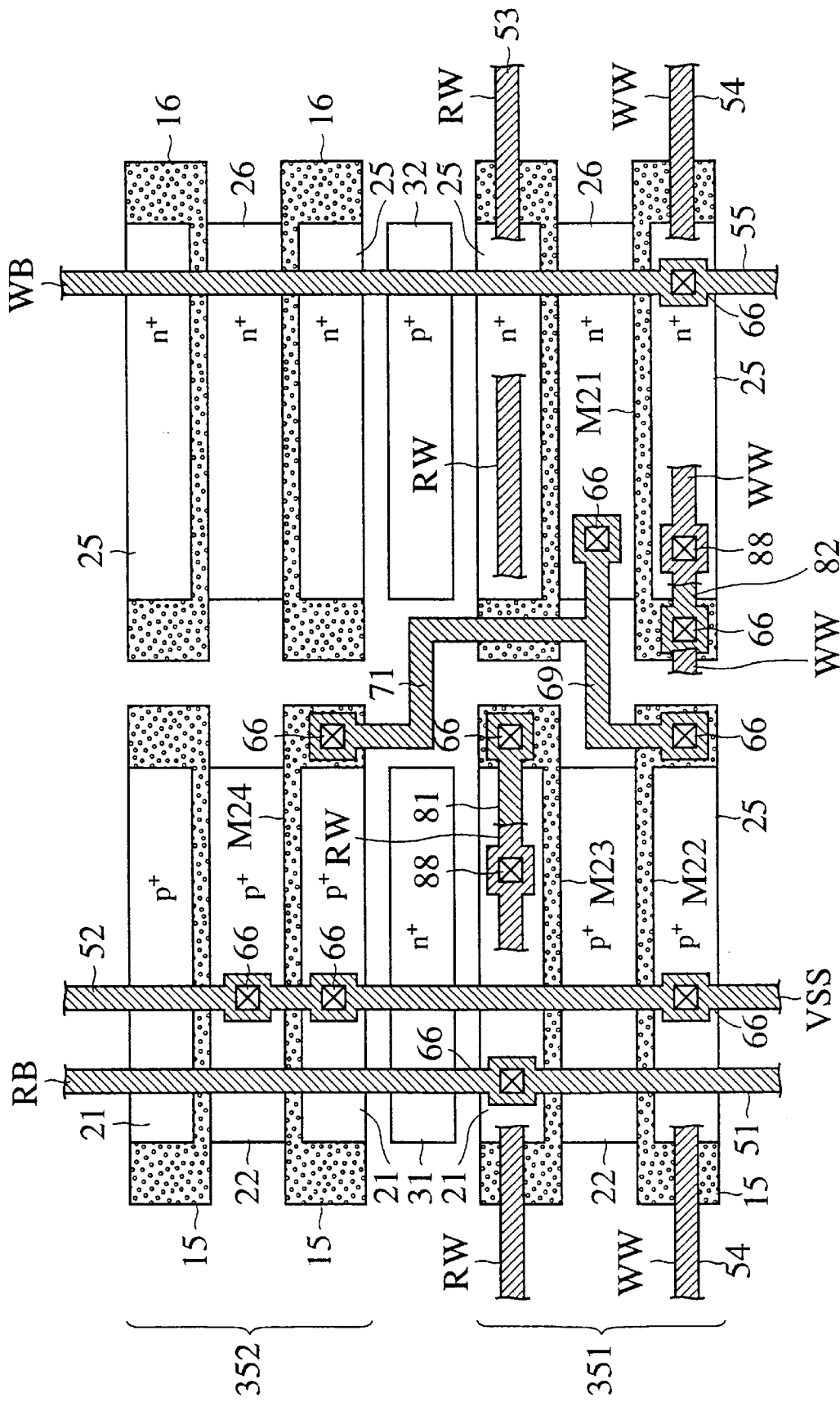
FIG. 9B is a plan view of a DRAM cell related to a modification of the third embodiment of the present invention.

FIG. 9B is a plan view of the gate-array representation of the circuit shown in FIG. 9A. As shown in FIG. 9B, in the basic cell 351, the p⁺ source region 21 of the pMOS transistor M22 and that of the pMOS transistor M23 are respectively connected to the VSS wiring 52 and the RB wiring 51 via their respective contact holes 66. The gate electrode 15 of the pMOS transistor M23 is connected to wiring 81 at first metal level through contact hole 66, and the wiring 81 is connected to the RW wiring at second metal level through via hole 88. Also, the nMOS transistor M21 formed in the basic cell 351 has its n⁺ source region 25 connected to the WB wiring 55 through contact hole 66. The gate electrode 16 of the nMOS transistor 21 is connected to wiring 82 at first metal level through contact hole 66, and the wiring 82 is connected to the WW wiring 54 at second metal level through via hole 88. And, in the basic cell 351 are interconnected the n⁺ drain region 26 of the nMOS transistor M21 and the gate electrode 15 of the pMOS transistor M22 via a wiring 69, which are also connected to the gate electrode 15 of the pMOS transistor M24 via a wiring 71. Both the p⁺ source region 21 and the p⁺ drain region 22 of the pMOS transistor M24 are connected to the VSS wiring 52.

Fourth Embodiment

The fourth embodiment of the present invention is described with reference to FIGS. 10A to 10C as follows. In contrast to the third embodiment, where the transistor M4 in a memory cell is connected to other transistors at its gate to increase the storage capacitance of DRAM, the fourth embodiment, as shown in FIG. 10A, interconnects the gate and the drain of a transistor M5 to utilize its gate capacitance (MOS capacitance) plus drain capacitance (junction capacitance), thus increasing the quantity of charge to be accumulated in a DRAM storage capacitor.

Figure 10A:
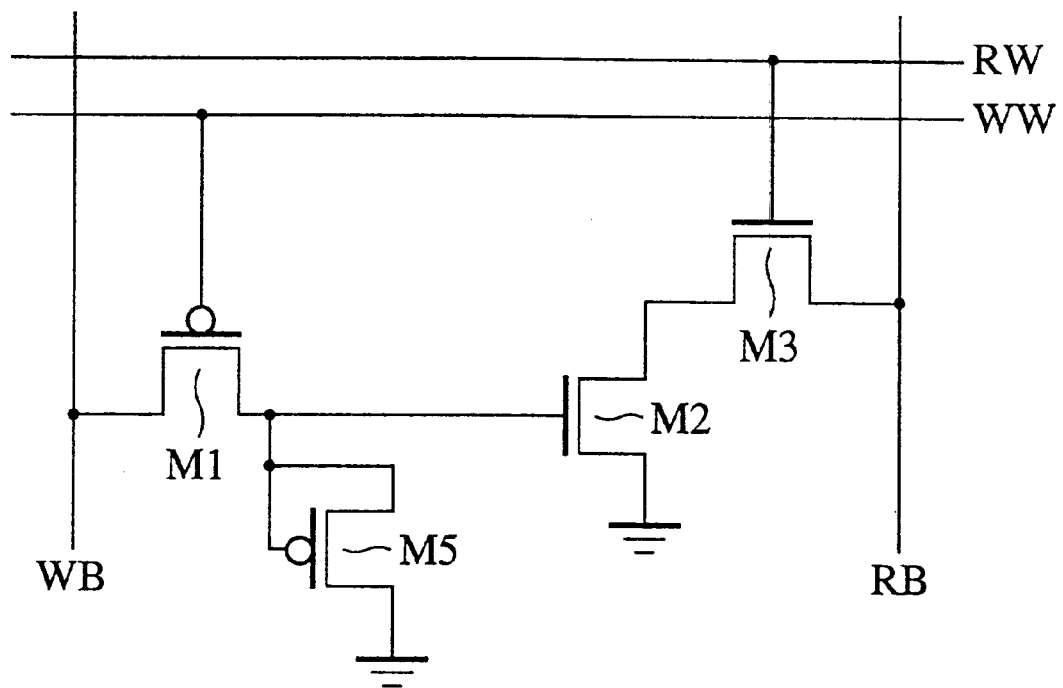
FIG. 10A is a circuit diagram of a DRAM related to the fourth embodiment of the present invention.
Figure 10B:
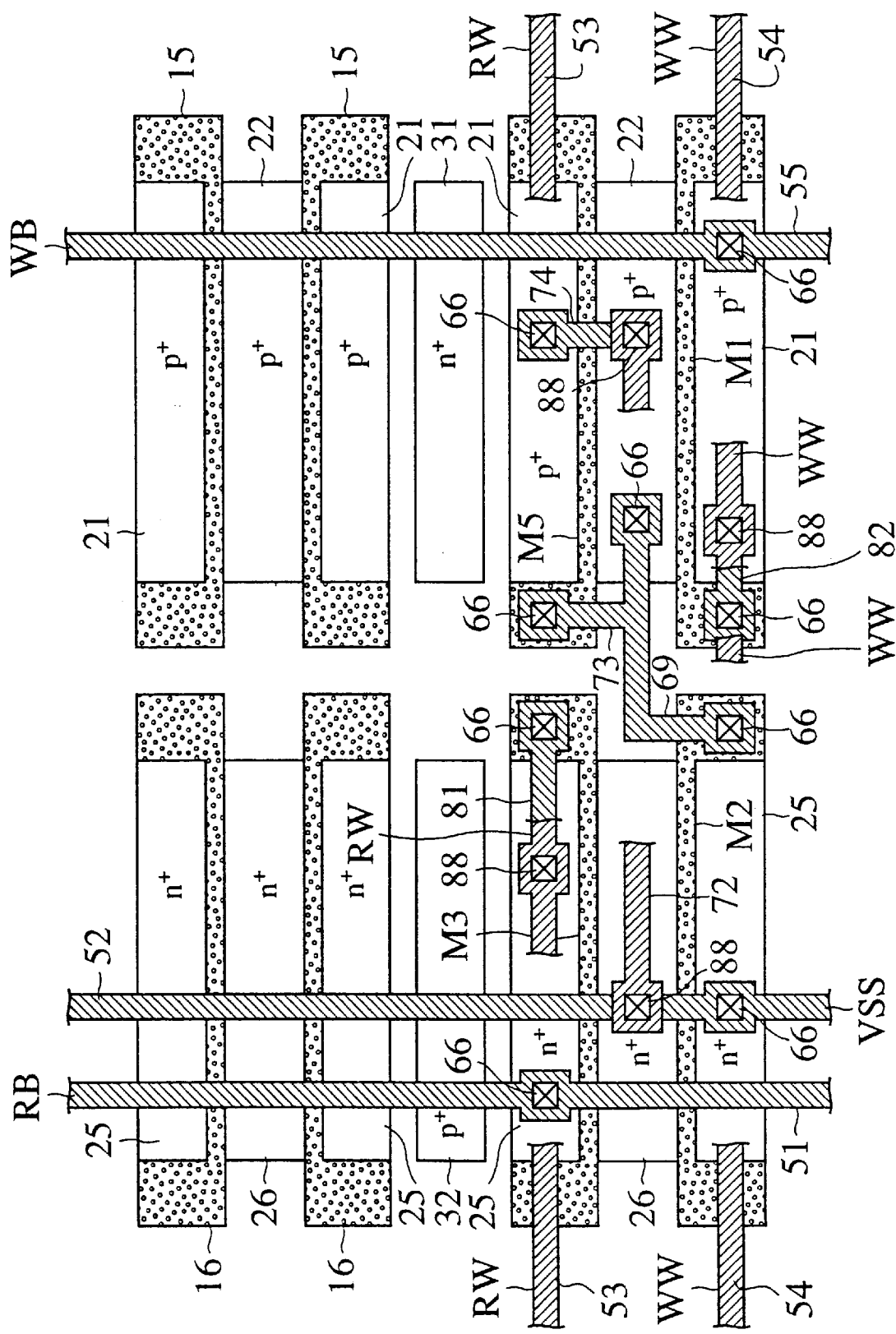
FIG. 10B is a plan view of a DRAM related to the fourth embodiment of the present invention.

Such a four-transistor memory-cell construction as shown in FIG. 10A is realized into such a pattern formed in one basic cell as shown in FIG. 10B. As shown in it, one basic cell is used to make up one memory cell of two nMOS transistors M2 and M3 and another two pMOS transistors M1 and M5. The pMOS transistor M1 acts as a write select transistor, while the nMOS transistors M2 and M3 act as a sense transistor and a read select transistor respectively. The remaining pMOS transistor M5 has its gate and drain interconnected and also connected to the drain of the write select transistor M1.

In FIG. 10B, the n⁺ source region 25 of the nMOS transistor M2 and that of the nMOS transistor M3 are respectively connected to the low-voltage power supply (VSS) wiring 52 and the RB wiring 51 via their respective contact holes 66. Also, the gate electrode 16 of the nMOS transistor M3 is connected to wiring 81 at first metal level through contact hole 66, and the wiring 81 is connected to the RW wiring 53 at second metal level through via hole 88. The RW wiring 53 runs perpendicular to the RB wiring 51. The pMOS transistor M1, on the other hand, has its p⁺ source region 21 connected respectively to the WB wiring 55 through contact hole 66. The gate electrode 15 of the pMOS transistor M1 is connected to wiring 82 at first metal level through contact hole 66, and the wiring 82 is connected to the WW wiring 54 at second metal level through via hole 88. The WW wiring 54 runs perpendicular to the WB wiring 55. The p+ drain region common to the pMOS transistors M1 and M5 and the gate electrode 16 of the nMOS transistor M2 are interconnected via a wiring 69 and also connected to the electrode 15 of the pMOS transistor M5 via a wiring 73. The p+ source region 21 of the pMOS transistor M5 is connected to the VSS wiring 52 via a wiring 74 at first metal level and a wiring 72 at second metal level. The RB wiring 51, VSS wiring 52 and WB wiring 55 are formed at first metal level and the RW wiring 53 and WW wiring 54 are formed at second metal level. The first and second metal levels are mutually isolated by an interlayer insulating film. The first metal level wirings and the second metal level wirings are interconnected with via holes 88.

Figure 10C:
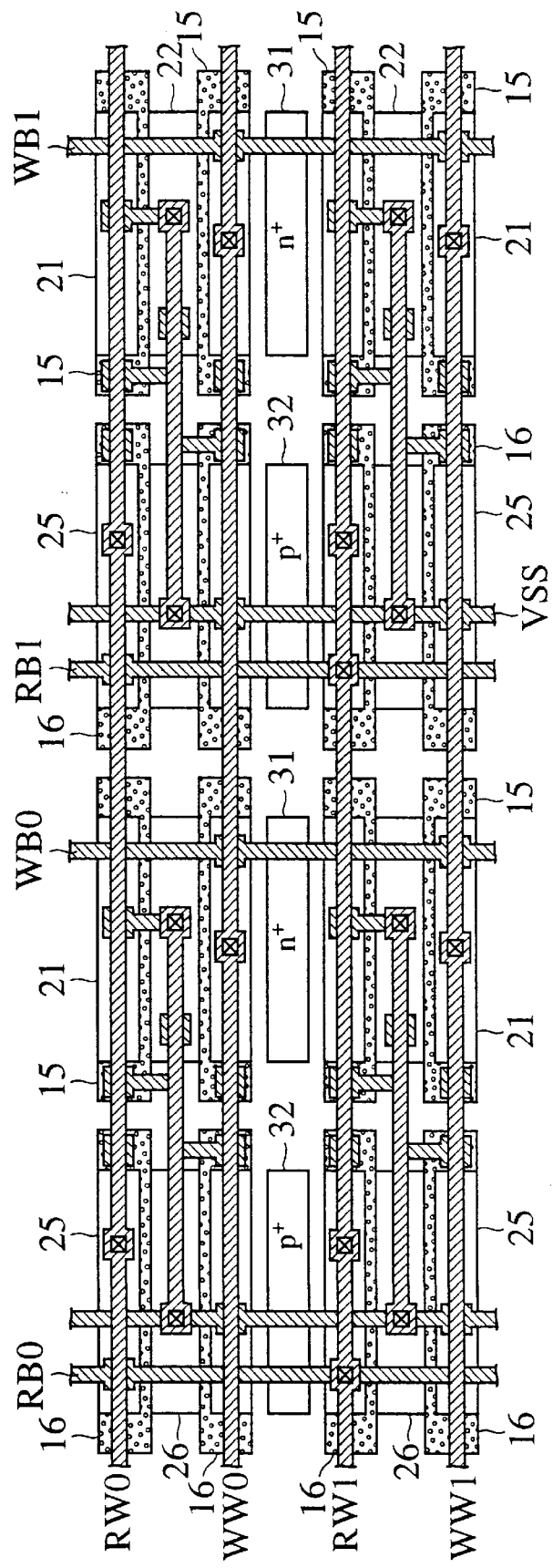
FIG. 10C is a plan view of an example of a matrix construction made of memory cells shown in FIG. 10B.

FIG. 10C shows an example of 2-by-2 matrix, in which a desired single DRAM cell being addressed at the intersection of RW0, RW1 and RB0, RB1 wirings, or WW0, WW1 and wB0, WB1 wirings. By disposing a plurality of memory cells formed in one basic cell as shown in FIG. 10B, it is possible to effectively utilize the memory area 7 in the logic-circuit construction region (see, FIG. 3) in which such n-blocks and p-blocks are disposed alternately. Also, by utilizing both the gate capacitance and the drain capacitance of the transistor M5, it is possible to increase the storage capacitance so as to improve the data retention characteristics.

Figure 11A:
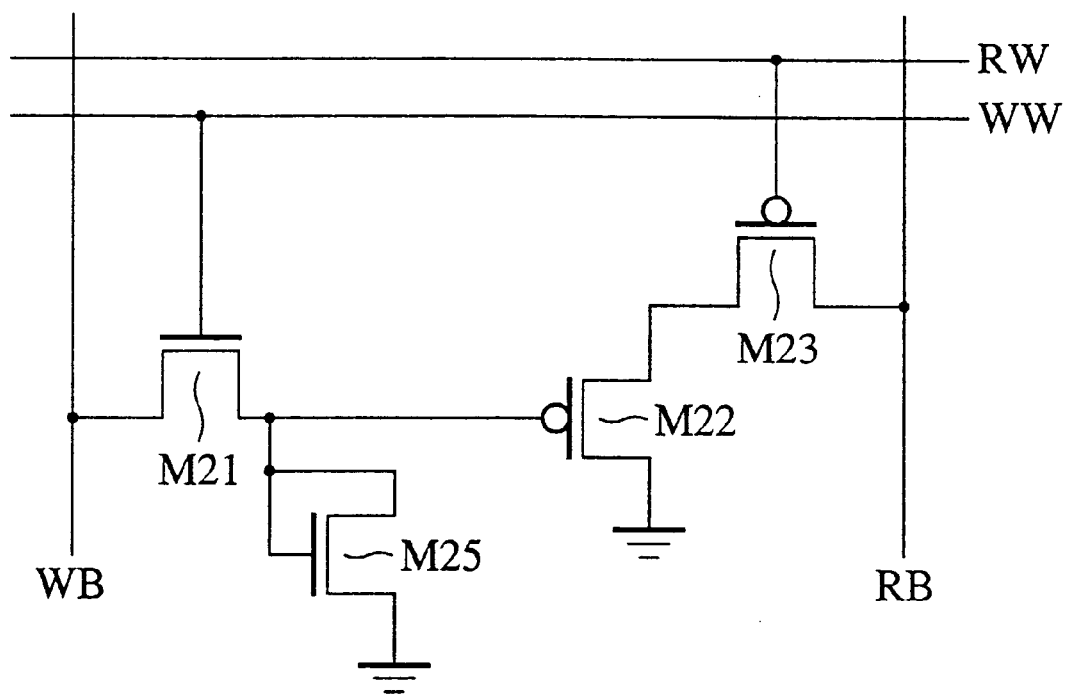
FIG. 11A is a circuit diagram of a DRAM related to a modification of the fourth embodiment of the present invention.
Figure 11B:
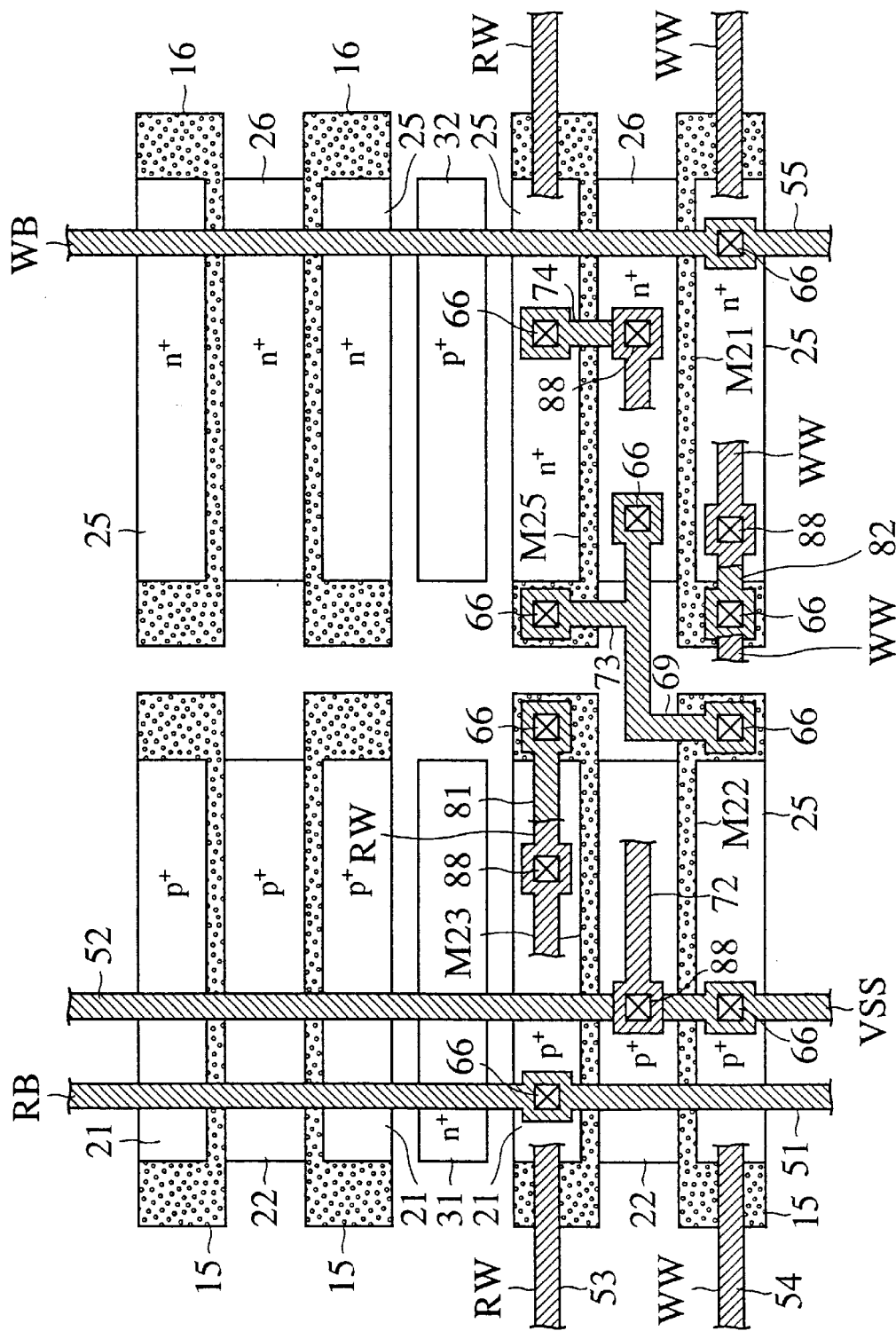
FIG. 11B is a plan view of a DRAM cell related to a modification of the fourth embodiment of the present invention.

It is also possible to, as shown in FIG. 11A, make up a four-transistor DRAM cell of two nMOS transistors M21 and M25 and another two pMOS transistors M22 and M23. Such circuit as shown in FIG. 11A is realized into such a pattern formed in a gate array as shown in the plan view of FIG. 11B. As shown in it, the p+ source region 21 of the pMOS transistor M22 and that of the pMOS transistor M23 are connected respectively to the VSS wiring 52 and the RB wiring 51 via their respective contact holes 66. The gate electrode 15 of the pMOS transistor M23 is connected to wiring 81 at first metal level through contact hole 66, and the wiring 81 is connected to the WR wiring at second metal level through via hole 88. The nMOS transistor M21, on the other hand, has its n+ source region 25 connected respectively to the WB wiring 55 through contact hole 66. The gate electrode 16 of the nMOS transistor 21 is connected to wiring 82 at first metal level through contact hole 66, and the wiring 82 is connected to the WW wiring 54 at second metal level through via hole 88. Also, the n+ drain region common to the nMOS transistors M21 and M25 and the gate electrode 15 of the pMOS transistor M22 are interconnected via a wiring 69 and also connected to the gate electrode 16 of the nMOS transistor M25 via a wiring 73. The n+ source region 25 of the nMOS transistor M25 is connected to the VSS wiring 52 via a wiring 74 at first metal level and a wiring 72 at second metal level. The wirings 74 and 52 are interconnected with the wiring 72 through via holes 88.

Fifth Embodiment

Figure 12A:
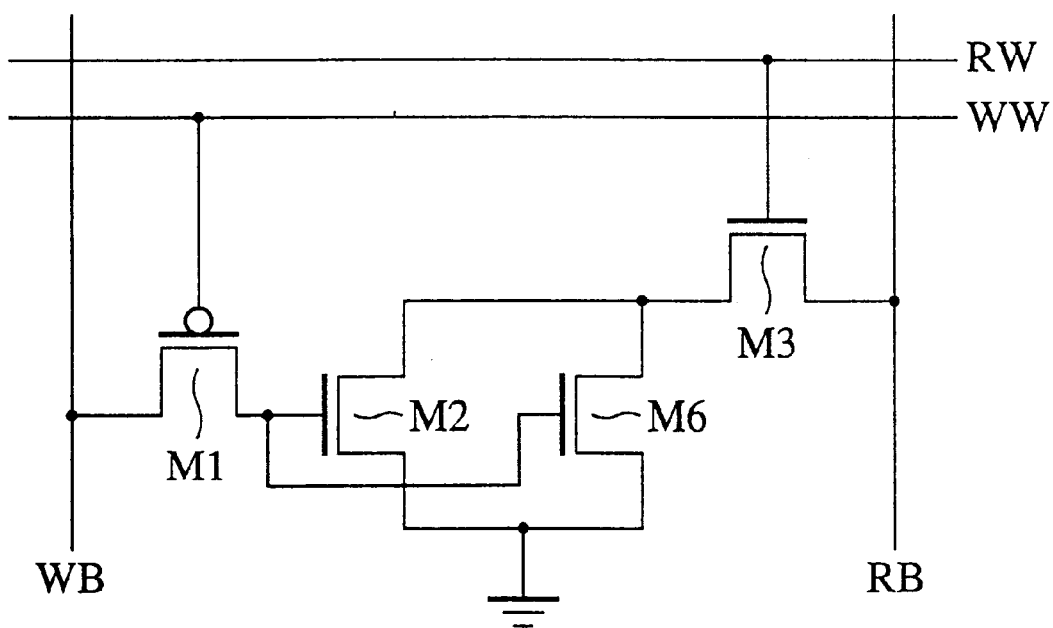
FIG. 12A is a circuit diagram of a DRAM related to the fifth embodiment of the present invention.

The fifth embodiment of the present invention is described with reference to FIGS. 12A to 12C as follows. As shown in FIG. 12A, the fifth embodiment connects a transistor M6 in parallel with the transistor M2 of a three-transistor DRAM cell shown in FIG. 6A. This parallel connection improves the driving capability of the transistor M2 which holds storage charge. Such a circuit construction as shown in FIG. 12A is realized into such a pattern as shown in FIG. 12B using two basic cells 321 and 322.

As can be seen from FIGS. 12A and 12B, the memory cell according to the fifth embodiment of the present invention consists of three nMOS transistors M2, M3, and M6 and one pMOS transistor M1. The pMOS transistor M1 acts as a write select transistor, while the nMOS transistors M2 and M3 act as a sense transistor and a read select transistor respectively. The remaining nMOS transistor M6 is connected in parallel with the nMOS transistor M2.

In the basic cell 321, the n+ source region 25 of the nMOS transistor M2 and that of the nMOS transistor M6 are connected to the low-voltage power supply (VSS) wiring 52 via their respective contact holes 66. The pMOS transistor M1, on the other hand, has its p+ drain region 21 connected to the WB wiring 55 through contact hole 66. The gate electrode 15 of the pMOS transistor M1 is connected to wiring 82 at first metal level through contact hole 66, and the wiring 82 is connected to the WW wiring 54 at second metal level through via hole 88. The WW wiring 54 runs perpendicular to the WB wiring 55. And, the p+ drain region 22 of the pMOS transistor M1 is connected via the wiring 69 to the gate electrodes 16 of the nMOS transistors M2 and M6.

In the basic cell 322 opposite to the basic cell 311 with the n+ and p+ contact regions 31 and 32 sandwiched therebetween, the nMOS transistor M3 is formed. The n+ drain region 26 of the nMOS transistor M3 is connected to the RB wiring via a contact hole 66. Also, the gate electrode 16 of the nMOS transistor M3 is connected to wiring 81 at first metal level through contact hole 66, and the wiring 81 is connected to the RW wiring 53 at second metal level through via hole 88. The RW wiring 53 runs perpendicular to the RB wiring 51. And, the n+ source region 25 of the nMOS transistor M3 is interconnected via a wiring 77 with the the n+ drain region 26 which is common to the nMOS transistors M2 and M6.

FIG. 12C shows an example of 2-by-2 matrix, in which a desired single DRAM cell being addressed at the intersection of RW0, RW1 and RB0, RB1 wirings, or WW0, WW1 and wB0, WB1 wirings. By disposing a plurality of memory cells so constructed as shown in FIG. 12B, it is possible to effectively utilize the memory area 7 (see FIG. 3) which disposes therein such n-blocks and p-blocks alternately, thus proving DRAM cells having a high driving capability of the sense transistor with aid of the transistor M6.

Figure 13A:
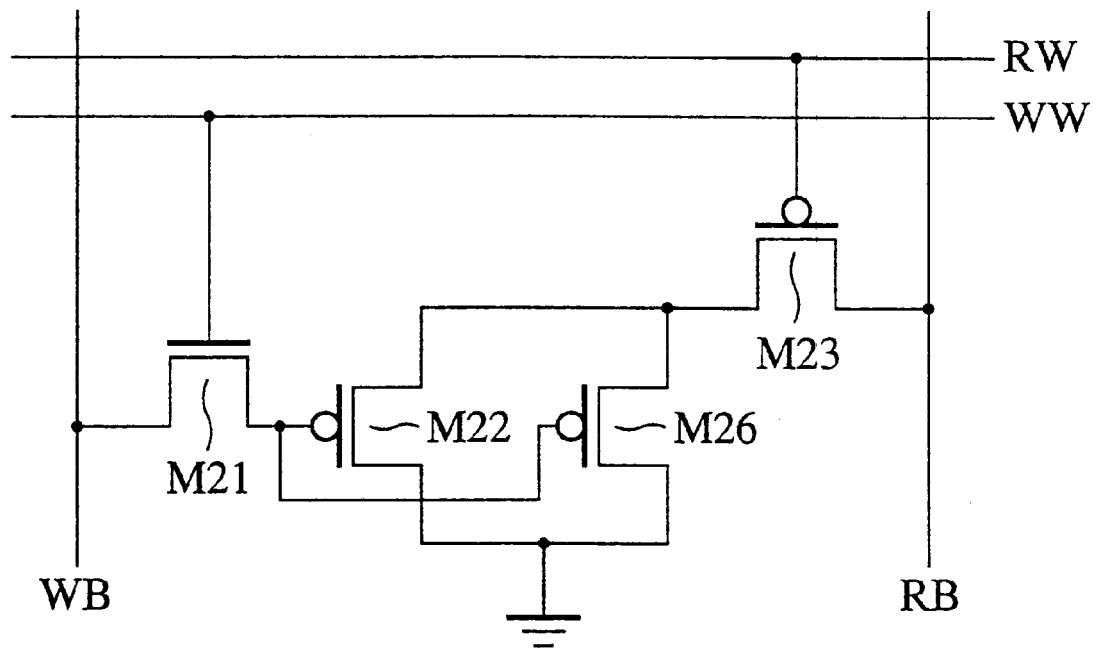
FIG. 13A is a circuit diagram of a DRAM related to a modification of the fifth embodiment of the present invention.
Figure 13B:
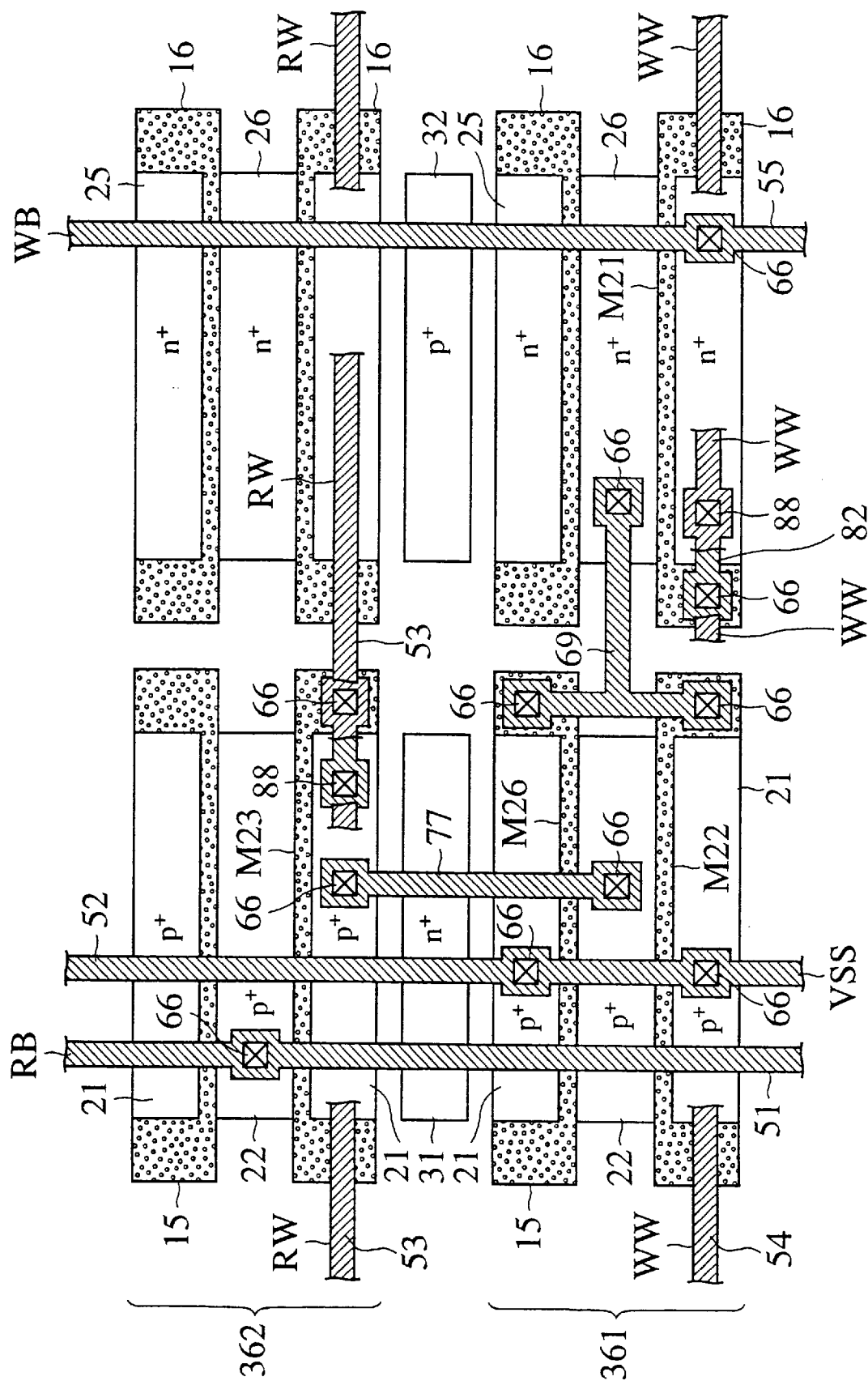
FIG. 13B is a plan view of a DRAM cell related to a modification of the fifth embodiment of the present invention.

It is also possible, as one modification of the fifth embodiment of the present invention, to make up a memory cell of one nMOS transistor M21 and three pMOS transistors M22, M23, and M26 as shown in FIG. 13A. Such a circuit construction as shown in FIG. 13A is realized into a pattern as shown in FIG. 13B formed in a gate array. In a basic cell 361, the p+ source region 21 of the pMOS transistor M22 and that of the pMOS transistor M26 are connected to the VSS wiring 52 via their respective contact holes 66. The nMOS transistor M21 has its n+ source region 25 connected respectively to the WB wiring 55 through contact hole 66. The gate electrode 16 of the nMOS transistor 21 is connected to wiring 82 at first metal level through contact hole 66, and the wiring 82 is connected to the WW wiring 54 at second metal level through via hole 88. And, the n+ drain region 26 of the nMOS transistor M21 is connected via a wiring 69 to the the gate electrodes 15 of the pMOS transistors M22 and M26. In a basic cell 362 opposite to the basic cell 361 with the n+ and p+ contact regions 31 and 32 sandwiched therebetween is formed the pMOS transistor M23. The p+ drain region 22 of the pMOS transistor M23 is connected to the RB wiring via a contact hole 66. The gate electrode 15 of the pMOS transistor M23 is connected to wiring 81 at first metal level through contact hole 66, and the wiring 81 is connected to the RW wiring at second metal level through via hole 88. And, the p+ source region 21 of the pMOS transistor M23 is connected to the p+ drain region 22, which is common to the pMOS transistors M22 and M26 via a wiring 77.

Various modifications will become possible for those skilled in the art after receiving the teachings of the present invention disclosure without departing from the scope thereof.

What is claimed is:

1. A gate array LSI for providing a semicustom IC, based upon a regular array of basic cells for implementing MOS transistors respectively, comprising:

alternate columns of p-block, each column of p-block includes a sequence of DRAM cells employing the basic cells, each cell having at least three pMOS transistors; and an alternate column of n-block, each column of n-block includes another sequence of DRAM cells employing the basic cells, each cell having at least three nMOS transistors.

2. The gate array LSI of claim 1, wherein the three pMOS transistors are write select pMOS transistor, a sense pMOS transistor whose gate is connected to a drain of the write select pMOS transistor, and a read select pMOS transistor whose drain is connected to a drain of the sense pMOS transistor, and the three nMOS transistors are a write select nMOS transistor, a sense nMOS transistor whose gate is connected to a drain of the write select nMOS transistor, and a read select nMOS transistor whose drain is connected to a drain of the sense nMOS transistor.

3. The gate array LSI of claim 2, wherein a p-block write bit wiring is connected to said write select pMOS transistor's source region, a low-voltage power supply wiring is connected to said sense pMOS transistor's source region, a p-block read bit wiring is connected to said read select pMOS transistor's source region, a p-block read word wiring is connected to said read select pMOS transistor's gate electrode, a p-block write word wiring is connected to said write select pMOS transistor's gate electrode, an n-block write bit wiring is connected to said write select nMOS transistor's source region, the low-voltage power supply wiring is connected to said sense nMOS transistor's source region, an n-block read bit wiring is connected to said read select nMOS transistor's source region, an n-block read word wiring is connected to said read select nMOS transistor's gate electrode, and an n-block write word wiring is connected to said write select nMOS transistor's gate electrode.

4. The gate array LSI of claim 3, wherein said p-block write word wiring and said p-block read word wiring are connected to a p-block row decoder, said p-block read bit wiring is connected to a p-block sense-amplifier, said n-block write word wiring and said n-block read word wiring are connected to an n-block row decoder, and said n-block read bit wiring is connected to an n-block sense wiring.

5. A gate array LSI for providing a semicustom IC, based upon a regular array of basic cells for implementing MOS transistors respectively, comprising a plurality of columns, each column comprising:

a p-block which includes a plurality of pMOS transistors employing the basic cells; and an n-block which includes a plurality of nMOS transistors employing the basic cells, wherein each column has a sequence of DRAM cells, each cell having at least three transistors.

6. The gate array LSI of claim 5, wherein the three transistors are a write select transistor, a sense transistor whose gate is connected to a drain of the write select transistor, and a read select transistor whose drain is connected to a drain of the sense transistor.

7. The gate array LSI of claim 6, wherein a write bit wiring is connected to said write select transistor's source region, the low-voltage power supply wiring is connected to said sense transistor's source region, the read bit wiring is connected to said read select transistor's source region, the read word wiring is connected to said read select transistor's gate electrode, and the write word wiring is connected to said write select transistor's gate electrode.

8. The gate array LSI of claim 7, wherein the write select transistor is a pMOS transistor and the sense and the read select transistors are nMOS transistors.

9. The gate array LSI of claim 8, further comprising another nMOS transistor whose gate electrode is connected to the drain region of the write select transistor and whose source and drain regions are connected to the low-voltage power supply wiring.

10. The gate array LSI of claim 8, further comprising another pMOS transistor whose gate and drain electrodes are connected to the drain region of said write select transistor and whose source region is connected to the low-voltage power supply wiring.

11. The gate array LSI of claim 8, further comprising another nMOS transistor which is connected in parallel with said sense transistor.

12. The gate array LSI of claim 7, wherein the write select transistor is an nMOS transistor and the sense and the read select transistors are pMOS transistors.

13. The gate array LSI of claim 12, further comprising another pMOS transistor whose gate electrode is connected to the drain region of the write select transistor and whose gate and drain regions are connected to the low-voltage power supply wiring.

14. The gate array LSI of claim 12, further comprising another nMOS transistor whose gate and drain regions are connected to the drain region of said write select transistor and whose source region is connected to the low-voltage power supply wiring.

15. The gate array LSI of claim 12, further comprising another pMOS transistor connected in parallel with said sense transistor.

16. A gate array LSI for providing a semicustom IC, based upon a regular array of basic cells for implementing MOS transistors respectively, comprising a logic-circuit construction region having a memory area disposed in a part thereof, the memory area comprising:

alternate columns of p-block, each column including a sequence of DRAM cells employing the basic cells, each cell having at least three pMOS transistors; and an alternate column of n-block, each column including another sequence of DRAM cells employing the basic cells, each cell having at least three nMOS transistors.

17. The gate array LSI of claim 16, wherein the three pMOS transistors are a write select pMOS transistor, a sense pMOS transistor whose gate is connected to a drain of the write select pMOS transistor, and a read select pMOS transistor whose drain is connected to a drain of the sense pMOS transistor, and the thee nMOS transistors are a write select nMOS transistor, a sense nMOS transistor whose gate is connected to a drain of the write select nMOS transistor, and a read select nMOS transistor whose drain is connected to a drain of the sense nMOS transistor.

18. The gate array LSI of claim 17, wherein a p-block write bit wiring is connected to said write select pMOS transistor's source region, a low-voltage power supply wiring is connected to said sense pMOS transistor's source region, a p-block read bit wiring is connected to said read select pMOS transistor's source region, a p-block read word wiring is connected to said read select pMOS transistor's gate electrode, a p-block write word wiring is connected to said write select pMOS transistor's gate electrode, an n-block write bit wiring is connected to said write select nMOS transistor's source region, the low-voltage power supply wiring is connected to said sense nMOS transistor's source region, an n-block read bit wiring is connected to said read select nMOS transistor's source region, an n-block read word wiring is connected to said read select nMOS transistor's gate electrode, and an n-block write word wiring is connected to said write select nMOS transistor's gate electrode.

19. A gate array LSI for providing a semicustom IC, based upon a regular array of basic cells for implementing MOS transistors respectively, comprising a logic-circuit construction region having a memory area disposed in a part thereof, the memory area having a plurality of columns, each column comprising:

a p-block which includes a plurality of pMOS transistors employing the basic cells; and an n-block which includes a plurality of nMOS transistors employing the basic cells, wherein each column has a sequence of DRAM cells, each cell having at least three transistors.

20. The gate array LSI of claim 19, wherein the three transistors are a write select transistor, a sense transistor whose gate is connected to a drain of the write select transistor, and a read select transistor whose drain is connected to a drain of the sense transistor.

21. The gate array LSI of claim 20, wherein a write bit wiring is connected to said write select transistor's source region, the low-voltage power supply wiring is connected to said sense transistor's source region, the read bit wiring is connected to said read select transistor's source region, the read word wiring is connected to said read select transistor's gate electrode, and the write word wiring is connected to said write select transistor's gate electrode.

22. A method for manufacturing a DRAM employing a gate array LSI, comprising the steps of:

(a) prefabricating alternate p-columns, each p-column having regularly arranged p-portion of basic cells, each p-portion of basic cells having $p^+$ source region, $p^+$ drain region and gate electrode, and alternate n-columns, each n-column having regularly arranged n-portion of basic cells, each n-portion of basic cells having $n^+$ source region, $n^+$ drain region and gate electrode; and (b) forming wirings on the p-portion of basic cells so as to implement alternate p-blocks, each p-block including a sequence of DRAM cells, each cell having at least three pMOS transistors, and forming wirings on the n-portion of basic cells so as to implement alternate n-blocks, each n-block including a sequence of another DRAM cells, each cell having at least three nMOS transistors.

23. A method for manufacturing a DRAM employing a gate array LSI, comprising the steps of:

(a) prefabricating alternate p-columns, each p-column having regularly arranged p-portion of basic cells, each p-portion of basic cells having $p^+$ source region, $p^+$ drain region and gate electrode, and alternate n-columns, each n-column having regularly arranged n-portion of basic cells, each n-portion of basic cells having $n^+$ source region, $n^+$ drain region and gate electrode; and (b) forming wirings on the basic cells so as to implement a plurality of columns, each column including a sequence of DRAM cells, each cell having at least three transistors formed on the basic cells.

* * * * *